(12) United States Patent
Kudoh et al.

(10) Patent No.: US 9,865,908 B2
(45) Date of Patent: Jan. 9, 2018

(54) ELECTRODE STRUCTURE OF SOLID TYPE SECONDARY BATTERY

(75) Inventors: Takuo Kudoh, Musashino (JP); Kiyoyasu Hiwada, Musashino (JP); Akira Nakazawa, Kobe (JP)

(73) Assignees: KABUSHIKI KAISHA NIHON MICRONICS, Tokyo (JP); GUALA TECHNOLOGY CO., LTD., Kobe (JP)

( * ) Notice: Subject to any disclaimer, the term of this patent is extended or adjusted under 35 U.S.C. 154(b) by 31 days.

(21) Appl. No.: 14/406,425

(22) PCT Filed: Jun. 6, 2012

(86) PCT No.: PCT/JP2012/064593
§ 371 (c)(1),
(2), (4) Date: Feb. 9, 2015

(87) PCT Pub. No.: WO2013/183132
PCT Pub. Date: Dec. 12, 2013

(65) Prior Publication Data
US 2015/0155608 A1 Jun. 4, 2015

(51) Int. Cl.
*H01L 31/00* (2006.01)
*H01M 14/00* (2006.01)
(Continued)

(52) U.S. Cl.
CPC .. *H01M 14/005* (2013.01); *H01L 31/022425* (2013.01); *H01L 49/006* (2013.01);
(Continued)

(58) Field of Classification Search
CPC .............. H01M 14/005; H01L 31/022425
See application file for complete search history.

(56) References Cited

U.S. PATENT DOCUMENTS 5,248,347 A 9/1993 Ochi
2008/0085439 A1* 4/2008 Hilliard ............... H01M 8/1286
429/495

(Continued)

FOREIGN PATENT DOCUMENTS

JP A-4-342172 11/1992
JP A-8-236898 9/1996
(Continued)

OTHER PUBLICATIONS

International Search Report issued in PCT/JP2012/064593 dated Jul. 17, 2012 (with translation).

*Primary Examiner* — Shannon Gardner
(74) *Attorney, Agent, or Firm* — Oliff PLC

(57) ABSTRACT

There is provided an electrode structure for preventing cracks occurring in a metal electrode due to heating in a manufacturing process in the case of stacking an insulating resin and the metal electrode which are different in thermal expansion coefficient. An electrode for a semiconductor circuit, stacked on a substrate made of an insulating resin, has an electrode structure composed of a main electrode including a slit formed by cutting out a part thereof to prevent occurrence of a crack in a manufacturing process caused by a difference in thermal expansion coefficient from the substrate, and an auxiliary electrode that covers the slit in the main electrode. No slit is provided but a bridge is formed at a portion where the slit in the main electrode and the slit in the auxiliary electrode overlap with each other, thereby eliminating a gap portion where the electrode does not exist.

16 Claims, 31 Drawing Sheets

(51) Int. Cl.
*H01L 31/0224* (2006.01)
*H01L 49/00* (2006.01)
*H01M 10/42* (2006.01)
*H01M 10/46* (2006.01)
*H02J 7/32* (2006.01)

(52) U.S. Cl.
CPC ....... *H01M 10/425* (2013.01); *H01M 10/465* (2013.01); *H02J 7/324* (2013.01)

(56) References Cited

U.S. PATENT DOCUMENTS

2009/0133741 A1* 5/2009 Higuchi ............... H01G 9/2031
136/252
2013/0276878 A1 10/2013 Nakazawa

FOREIGN PATENT DOCUMENTS

| JP | A-10-223698 | 8/1998 |
|----|----|----|
| JP | A-2000-114556 | 4/2000 |
| JP | A-2000-260811 | 9/2000 |
| JP | B2-3531866 | 5/2004 |
| JP | A-2007-179893 | 7/2007 |
| JP | A-2008-071537 | 3/2008 |
| JP | A-2008-288536 | 11/2008 |
| JP | 2011-176288 A | 9/2011 |
| JP | A-2011-178288 | 9/2011 |
| WO | WO 2012/046325 A1 | 4/2012 |
| WO | WO 2012/046326 A1 | 4/2012 |

* cited by examiner (A)           (B)

(A)

(B)

68 ANALYSIS MODEL (A)

(B)

(A)

78 SLIT ELECTRODE (B)

80 SLIT ELECTRODE (A)

(B)

130 RECTANGULAR MESH SLIT ELECTRODE WITH BRIDGES

ELECTRODE STRUCTURE OF SOLID TYPE SECONDARY BATTERY

TECHNICAL FIELD

The present invention relates to an electrode structure of a solid type secondary battery in which a charge function layer having a function of charging electric energy therein sandwiched between electrodes and stacked on a substrate.

BACKGROUND ART

Secondary batteries are widely spread from mobile terminals such as cellular phone, notebook computer and so on to electric vehicles, and repeatedly used by charging/discharging. Examples of conventional secondary batteries include a nickel-cadmium battery and a lithium-ion battery, and have a basic structure in which a layer having a charge function is sandwiched between electrodes. The nickel-cadmium battery is a battery using nickel hydroxide as a cathode and cadmium hydroxide as an anode, and the lithium-ion battery uses an oxide containing lithium as a positive electrode and graphite as a negative electrode (refer to Patent Document 1).

In contrast, the present inventors suggest an all-solid type semiconductor battery (hereinafter, referred to as a quantum battery) capable of reduction in cost and safe operation with a simple configuration (PCT/JP 2010-067643). This quantum battery is based on the operation principle of utilizing a photoexcitation structural change of a metal oxide by ultraviolet irradiation to form a new energy level in a band gap, and trapping electrons into the intermediate energy level to perform charge.

In this quantum battery, a metal oxide coated with an insulator is used as a charge layer, and cracks may occur in the electrode due to a difference in thermal expansion coefficient between a base material and the electrode in a baking process by heating when manufacturing the charge layer.

The problem caused from the difference in thermal expansion coefficient between the base material and the electrode also applies to general semiconductor integrated circuits and solar batteries, and therefore various suggestions have conventionally been made.

For example, a photoelectric conversion element and a thin film solar battery are suggested in which to relax the difference in thermal expansion coefficient between the base material and the electrode, a stress relaxation layer is provided on an insulating layer to suppress peeling off of a layer constituting the photoelectric conversion element are suggested. They are structured such that, on a substrate with insulating layer including a metal substrate made by stacking a metal base material and an Al base material into one body and an electric insulating layer formed on the surface of the Al base material of the metal substrate, a stress relaxation layer formed on the electric insulating layer is provided, and a lower electrode formed on the stress relaxation layer, a photoelectric conversion layer formed on the lower electrode and composed of a compound semiconductor layer, and an upper electrode formed on the photoelectric conversion layer are provided (refer to Patent Document 2).

An example utilizing a stress relaxing connecting medium is an example in which a printed wiring board different in thermal expansion coefficient from a land grid array-type package is bonded thereto with high reliability. A land grid array-type semiconductor package having an array-shaped terminal electrode and a printed wiring board having an electrode with the same arrangement as the array-shaped terminal electrode, are electrically connected together through a flexible stress relaxing connecting medium which has a first connecting pad connected to the array-shaped electrode of the land grid array-type package and a second connecting pad connected to the electrode on the printed wiring board. The stress relaxing connecting medium is a flexible sheet, and has a through hole for electrical connection and a cutout at a predetermined portion of the flexible sheet (refer to Patent Document 3).

An example utilizing a stress relaxing slit is an example utilizing a surface mounting type ceramic substrate. It is possible to prevent cracks from occurring at a bonding part intervening between an external connecting electrode and a conductor pattern of a wiring board due to a difference in thermal expansion coefficient between a ceramic substrate main body and the wiring board, and prevent cracks from occurring at the ceramic substrate main body due to a tensile stress generated in the ceramic substrate main body. In the surface mounting type ceramic substrate, a slit for relaxing stress of the bonding part is formed between a portion where the external connecting electrode is provided and a portion where a heat radiating conductor part is provided in the ceramic substrate main body. A portion of the ceramic substrate main body where the tensile stress is concentrated is formed thick to have a thickness dimension larger than that of the portion where the external connecting electrode is provided (refer to Patent Document 4).

Further, in the case where a semiconductor chip is subjected to face down bonding on a circuit board and a glass substrate and electrically and mechanically connected thereto, thermal stress concentrates on a solder after melting a solder bump and a conductive adhesive due to a difference in thermal expansion coefficient between the circuit board, the glass substrate, and the semiconductor chip, so that debonding occurs between the circuit board and the solder and between the glass substrate and the conductive adhesive. Therefore, in Japanese Laid-open Patent Publication No. 2000-260811, many slits are provided in the rear surface of the semiconductor chip to make the semiconductor chip follow a warp of the circuit board and the glass substrate, so as to relax the intrinsic stress caused by the thermal expansion difference occurring in the solder after melting the solder bump, the glass substrate, and the conductive adhesive (refer to Patent Document 5).

Further, in Japanese Laid-open Patent Publication No. 1998-223698, a reinforcing plate provided with slits is suggested to relax and disperse the stress generated by a difference in thermal expansion between a TAB tape reinforcing plate and a mounting board in a Tape-BGA type semiconductor device. The Tape-BGA type semiconductor device is formed such that a signal wiring is formed on a heat resistant insulating resin film such as polyimide or the like, and after the tip part of the signal wiring is electrically connected to the electrode of a semiconductor element, the reinforcing plate formed with a semiconductor element mounting aperture is fixed to the surface of the heat resistant insulating resin film, and then a solder ball is mounted on the outer connection part of the signal wiring. In the Tape-BGA type semiconductor device, a slit part is provided along the aperture of the reinforcing plate (refer to Patent Document 6).

PRIOR ART DOCUMENT

Patent Document

Patent Document 1: Japanese Patent No. 3531866
Patent Document 2: Japanese Laid-open Patent Publication No. 2011-178288
Patent Document 3: Japanese Laid-open Patent Publication No. 1996-236898
Patent Document 4: Japanese Laid-open Patent Publication No. 2008-288536
Patent Document 5: Japanese Laid-open Patent Publication No. 2000-260811
Patent Document 6: Japanese Laid-open Patent Publication No. 1998-223698

DISCLOSURE OF THE INVENTION

Problems to be Solved by the Invention

To realize a secondary battery with a large capacity with a simple configuration, the present invention is intended for a quantum battery being a secondary battery configured by stacking a conductive first electrode, a charge layer having an n-type metal oxide semiconductor covered with an insulating material and undergone a photoexcitation structural change to form an energy level in a band gap so as to trap electrons, a p-type semiconductor layer, and a conductive second electrode.

This quantum battery has a stacked structure in which a substrate made by stacking a polyimide film being an insulating resin on a glass plate is used and the charge layer and the p-type semiconductor layer are sandwiched between electrodes from both sides, and a metal material is used as the electrode material. The stacked structure has a problem of cracks occurring in the electrodes due to heating in a baking process in manufacture of the quantum battery because the polyimide film and the electrodes are different in thermal expansion coefficient.

Decreasing the thermal expansion coefficient being a physical value of the polyimide film requires use of a material at high cost. On the other hand, provision of a stress relaxation layer that is the conventionally suggested technique makes it hard to select a material and causes a cost increase due to an increase in the number of layers in terms of structure. Further, it is impossible to apply the conventional techniques of providing the slits in the rear surface of the semiconductor chip, using the reinforcing plate provided with the slits and the like. Even if, for example, slits are provided in the electrode to relax the stress, the charge layer of the quantum battery on the surface facing the electrode functions, so that slit portions do not serve as the charge layer to cause a problem of deterioration in performance.

An object of the present invention is to provide an electrode structure for preventing cracks occurring in a metal electrode due to heating in a manufacturing process when stacking an insulating resin and a metal electrode different in thermal expansion coefficient, and to provide a semiconductor functional element, in particular, a quantum battery having a charge function, in which occurrence of cracks is prevented by applying the electrode structure thereto.

Means to Solve the Problems

The present invention is an electrode for a semiconductor circuit, stacked on a substrate made of an insulating resin, wherein the electrode structure is composed of a main electrode including a slit formed by cutting out a part thereof to prevent occurrence of a crack in a manufacturing process caused by a difference in thermal expansion coefficient from the substrate, and an auxiliary electrode that covers the slit in the main electrode. The insulating resin expands by heating and more greatly displaces with distance from a central portion and therefore applies a larger stress on the stacked electrodes with distance from the central portion. Therefore, it is preferable that a plurality of slits are arranged in the main electrode and an interval between the slits is made narrower with distance from a center of the main electrode.

A plurality of slits in the main electrode are formed concentrically from a central portion of the main electrode, or formed in rectangular shapes to surround a central portion of the main electrode. Further, in electrode portions divided by the plurality of slits arranged in the main electrode and the auxiliary electrode, subdivision slits may be arranged each of which further divides the electrode portion into a plurality of electrodes, to make the electrode pattern to small surfaces so as to disperse the stress.

In this case, the subdivision slits arranged in the main electrode and the subdivision slits arranged in the auxiliary electrode are arranged at positions where the subdivision slits do not overlap with each other. Further, division slits are not arranged at portions where the subdivision slits overlap with the slits arranged in the main electrode and the auxiliary electrode, thereby making it possible to eliminate gap portions generated by the slits and the subdivision slits.

A slit in the auxiliary electrode can be arranged by displacing a same pattern as a pattern of the slit in the main electrode, or may be arranged by rotating a same pattern as a pattern of the slit in the main electrode. The slit in the main electrode in this case is in a mesh shape that divides the electrode into rectangles, or may be the slit that divides the electrode into circles. A rectangular or circular divided electrode divided by the slit located at a position distant from a center of the electrode is made smaller than a divided electrode located at a central portion, thereby coming to be able to cope with a larger stress.

Also in this case, no slit is provided at a portion where the slit in the main electrode and the slit in the auxiliary electrode overlap with each other, thereby eliminating existence of a gap portion generated by the slits.

The present invention provides the electrode structure for preventing occurrence of cracks in the electrode in the manufacturing process due to the difference in thermal expansion coefficient between the substrate and the electrode. The occurrence of cracks is caused by the heating in the manufacturing process, and the electrode using a metal material is oxidized by the heating and deteriorates. Therefore, the main electrode and the auxiliary electrode are a metal material having passive characteristics for preventing oxidation. Further, for preventing oxidation of the metal electrode due to heating, a metal layer having passive characteristics may be stacked to prevent oxygen in air from coming into contact therewith.

The metal material usable as the passive layer is at least one kind of chromium, nickel, titanium, and molybdenum, or an alloy containing one kind of chromium, nickel, titanium, and molybdenum.

By using the electrode for a semiconductor circuit according to the present invention and stacking a functional layer that functions by electric energy supplied from the electrode on a substrate, the electrode is applicable to a semiconductor functional element requiring a heating process. In particular, in the semiconductor functional element as a secondary battery in which the functional layer charges electric energy therein, it is necessary to cover the entire functional layer by the electrode and to prevent occurrence of cracks in the electrode over a large area, so that application of a slit electrode is effective.

The functional layer includes a charge layer composed of an n-type metal oxide semiconductor with an insulating coating and irradiated with ultraviolet rays to undergo a photoexcitation structural change, and a p-type metal oxide semiconductor layer. In this case, there is a process of baking the n-type metal oxide semiconductor in the manufacturing process, so that use of the slit electrode makes it possible to prevent cracks occurring in the electrode due to the heating in the baking process.

Effects of the Invention

According to the electrode structure provided with slits according to the present invention, in the case of manufacturing a semiconductor functional element using materials different in thermal expansion coefficient between the electrode and the substrate, the difference in expansion coefficient between the electrode and the substrate due to the heating in the manufacturing process can be absorbed by the slits in the electrode, thus preventing occurrence of cracks in the electrode surface.

In particular, the secondary battery having the charge function in the functional layer is made by stacking the electrode on the entire charge layer and thus requires an electrode with a large area, so that cracks become more likely to occur in the electrode. Also in this case, the electrode for a semiconductor circuit according to the present invention provides great effects and can absorb the displacement by the slits to prevent occurrence of cracks.

Further, a metal material having passive characteristics is used as the material of the electrode to prevent the problem of debonding of the electrode by oxidation of the metal electrode due to the heating in the manufacturing process and suppress oxidation of the electrode due to aging, thereby preventing deterioration and debonding to provide a stable quantum battery capable of repeatedly charge/discharge for a long period.

BEST MODE FOR CARRYING OUT THE INVENTION

For an electrode for a semiconductor circuit, stacked on a substrate made of an insulating resin, a metal material is generally used and is greatly different in thermal expansion coefficient from the substrate made by using the insulating resin or the like. Therefore, in the case of using a stacking technique in which a functional layer formed by being stacked on the electrode is heated to high temperature during manufacture, cracks may occur in the electrode due to the difference in thermal expansion coefficient. The present invention forms a slit in the electrode to absorb displacement due to the difference in thermal expansion coefficient in order to prevent occurrence of cracks in the electrode. Especially, the secondary battery requires formation of the electrode in a solid pattern on the entire surface of the charge layer, and in such a case of a large area of the functional layer, the effect of the slit is prominent.

Figure 1:
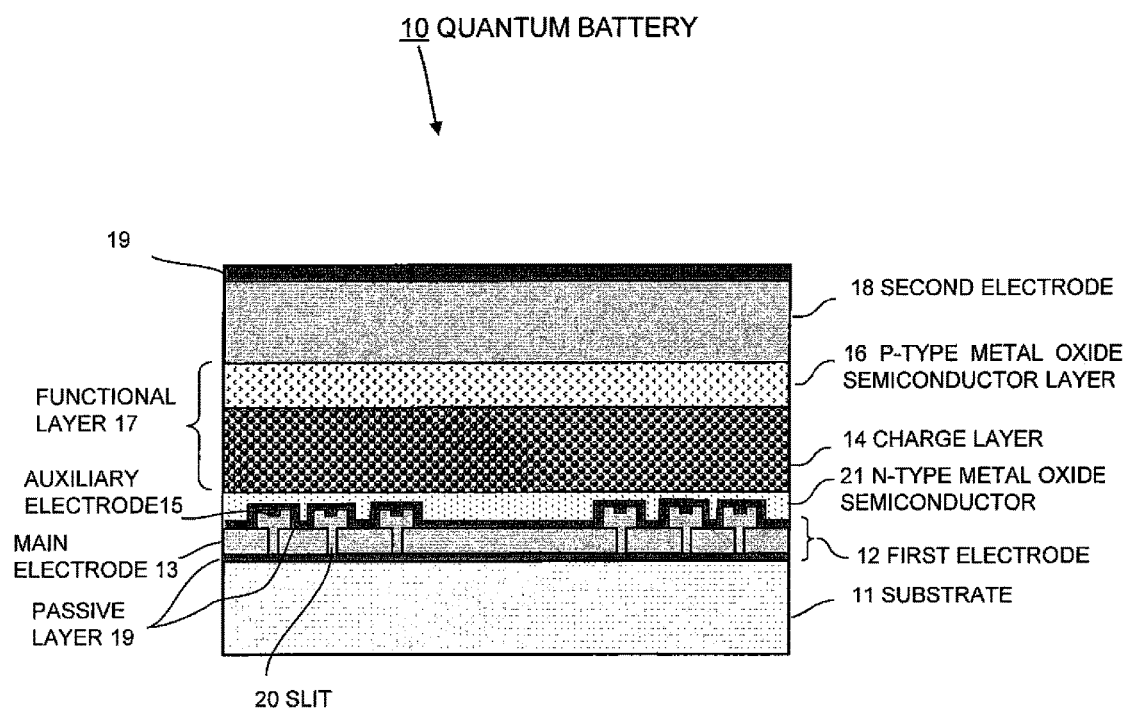
FIG. 1 is a view illustrating a quantum battery using a slit electrode structure according to the present invention.

FIG. 1 illustrates a cross-sectional view of a quantum battery being an all-solid type secondary battery as a semiconductor functional element and having an intermediate band in an energy gap.

In FIG. 1, a quantum battery 10 is made by stacking a first electrode 12 on a substrate 11. The first electrode 12 has a double-stack structure including a main electrode 13 provided with slits 20 and an auxiliary electrode 15 composed of an electrode covering the slits 20 in the main electrode. Hereinafter, the electrode in the double-stack structure including the main electrode 13 provided with the slits 20 and the auxiliary electrode 15 composed of the electrode covering the slits 20 in the main electrode, is called a slit electrode. Further, slits in shapes forming not only a thin groove-shaped gap but also a gap leaving the electrode therein are called slits in a broad sense.

The slid electrode is intended to prevent occurrence of cracks in a manufacturing process of heating at high temperature when forming a functional layer 17. In the case where a metal material is used for the electrode, for example, in the case where copper, a copper alloy, nickel, aluminum, zinc, tin or the like is used, the electrode material also deteriorates due to oxidation when heated to high temperature. For this reason, passive layers 19 are provided across the slit electrode as illustrated in FIG. 1.

A passive state means the state of metal corroding at a very low rate even though the metal is at a poor (active) position in the electrochemical series, and is a property being the basis of the corrosive resistance of the metal material. A metal greatly polarizing by a small anode current is passivated by getting closer to the behavior of a electrochemically noble (non-active) metal.

In this case, an oxide coating as a corrosion product comes to have protective performance to provide corrosion resistance. Examples of the metal material having passive characteristics include chromium, nickel, titanium, molybdenum and so on, or may be an alloy containing at least one kind of chromium, nickel, titanium, molybdenum and so on.

On the first electrode 12, the functional layer 17 is stacked. In the case of the quantum battery in this embodiment, a charge layer 14 and a p-type metal oxide semiconductor layer 16 are stacked as the functional layer 17. Further, a second electrode 18 and a passive layer 19 are stacked to function as the quantum battery.

The second electrode 18 is formed using the same metal material as that of the first electrode 12 but is not oxidized due to heating because it is formed after the manufacturing process of the functional layer 17 heated at high temperature. However, if the second electrode 18 is left as it is in an atmospheric environment, it reacts with oxygen in the atmosphere in the long term and is oxidized and thereby deteriorated.

For example, in the case of using copper as the second electrode, a coating of copper oxide is formed or basic copper carbonate is formed if the humidity is high. Further, it may be oxidized by sulfur oxide contained in air to form copper sulfide or copper sulfate. Its significant deterioration causes peeling and loses reliability in the long term, resulting in a factor of shortening the product lifetime. For this reason, the second electrode 18 is also provided with the passive layer 19 for preventing oxidation.

Figure 2:
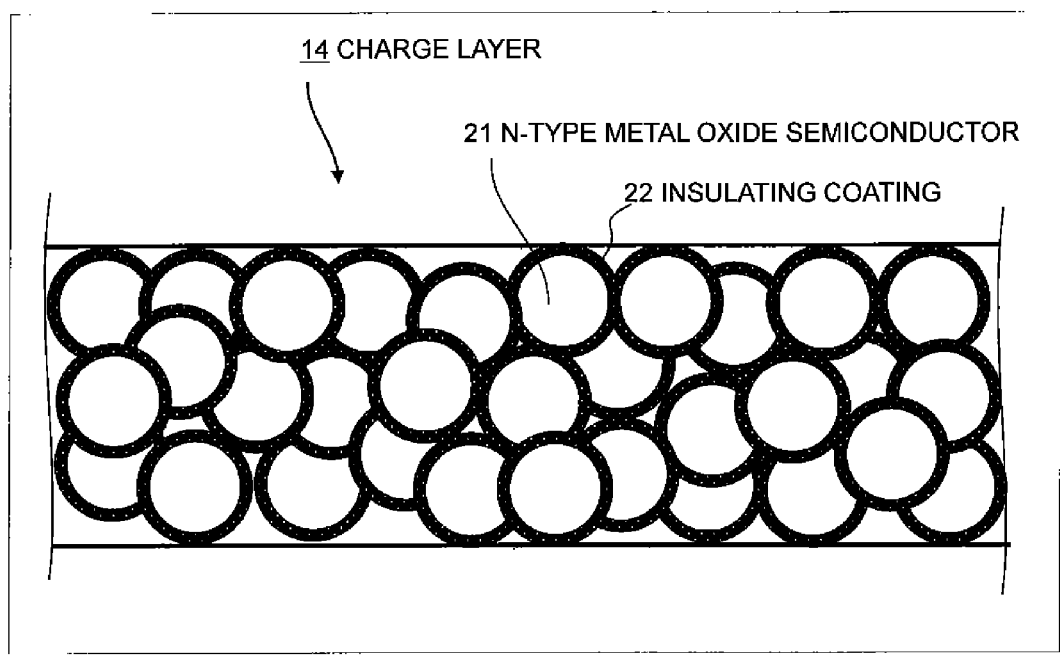
FIG. 2 is a view for explaining a charge layer of the quantum battery according to the present invention.

FIG. 2 is a view for explaining the charge layer 14 of the quantum battery 10. In FIG. 2, the charge layer 14 uses silicone as an insulating coating 22 and titanium dioxide as an n-type metal oxide semiconductor 21, and has a structure that titanium dioxide made into fine particles are covered with silicone and filled in the charge layer 14. Titanium dioxide is irradiated with ultraviolet rays to undergo a photoexcitation structural change and thereby have a function of storing energy.

Examples of the material of the n-type metal oxide semiconductor 21 used for the charge layer 14 include titanium dioxide, stannic oxide, and zinc oxide, which is manufactured by decomposing aliphatic acid salt of metal. Therefore, as the aliphatic acid salt of metal, the one capable of changing into a metal oxide by combustion under an oxidizing atmosphere is used. Use of the material having passive characteristics as the metal electrode can prevent oxidation due to combustion.

For the insulating coating 22, mineral oil, magnesium oxide (MgO), or silicon dioxide ($SiO_2$) as an inorganic insulating material may be used in addition to silicone. The insulating resin may be a thermoplastic resin such as polyethylene or polypropylene or a thermosetting resin such as phenol resin or amino resin.

In the charge layer 14, the material irradiated with ultraviolet rays undergoes a photoexcitation structural change to form a new energy level. The photoexcitation structural change is a phenomenon that the interstitial distance of the material excited by irradiation of light changes, and the n-type metal oxide semiconductor 21 being an amorphous metal oxide has the property of undergoing the photoexcitation structural change. The formation state of the new energy level due to the photoexcitation structural change in the case of using titanium dioxide as the n-type metal oxide semiconductor 21 and silicone as the material of the insulating coating in the charge layer 14 will be described below using a band chart.

Figure 3:
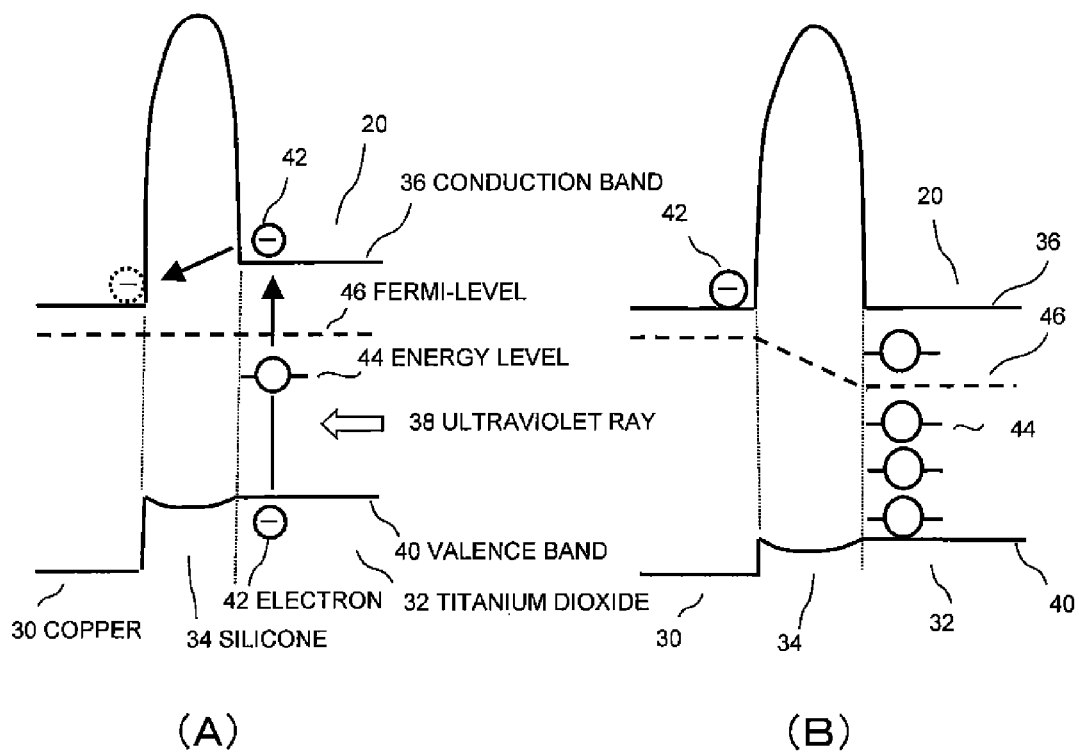
FIG. 3 is a band chart for explaining a new energy level formed due to a photoexcitation structural change.

FIG. 3(A), (B) is a band chart for explaining the formation state of a new energy level 44 due to the photoexcitation structural change when silicone 34 exists as the insulating coating 22 between a metal copper 30 as the first electrode 12 and a titanium dioxide 32 as the n-type metal oxide semiconductor 21. Due to the photoexcitation structural change, the new energy level 44 is formed in the band gap of the n-type metal oxide semiconductor 21. In a conduction band 36, a barrier exists by the insulating layer made of the silicone 34.

FIG. 3(A) illustrates a state that ultraviolet rays 38 are applied when the insulating layer composed of the silicone 34 is provided between the titanium dioxide 32 and the copper 30.

When the titanium dioxide 32 with insulating coating is irradiated with the ultraviolet rays 38, electrons 42 existing in a valence band 40 of the titanium dioxide 32 are excited to the conduction band 36. Near an interface with the copper 30, the electrons 42 pass through the insulating layer being the silicone 34 with a certain probability and temporarily move to the copper 30. The photoexcitation structural change of the titanium dioxide 32 occurs in the absence of the electrons 42, and the interatomic distance changes at a part from which the electrons 42 in the valence band 40 have moved. The energy level 44 at this time moves to the band gap in Fermi-level 46.

FIG. 3(B) illustrates a state that the above-described phenomenon repeatedly occurs during irradiation of the ultraviolet rays 38, and many energy levels 44 are formed in the band gap. However, the electrons 42 to be trapped by the energy levels 44 have been excited by the ultraviolet rays 38 and moved to the copper 30. Thus generated energy levels 44 in the band gap where no electrons exist remain also after the end of the irradiation of the ultraviolet rays.

The role of the silicone 34 as the insulating layer is to form a barrier between the copper 30 and the titanium dioxide 32, cause the excited electrons 42 to pass therethrough by the tunnel effect, and form the energy levels 44 in the band gap where no electrons exist. The electrons 42 moved to the copper 30 stay in the copper 30 by the charge potential around the silicone 34.

Figure 4:
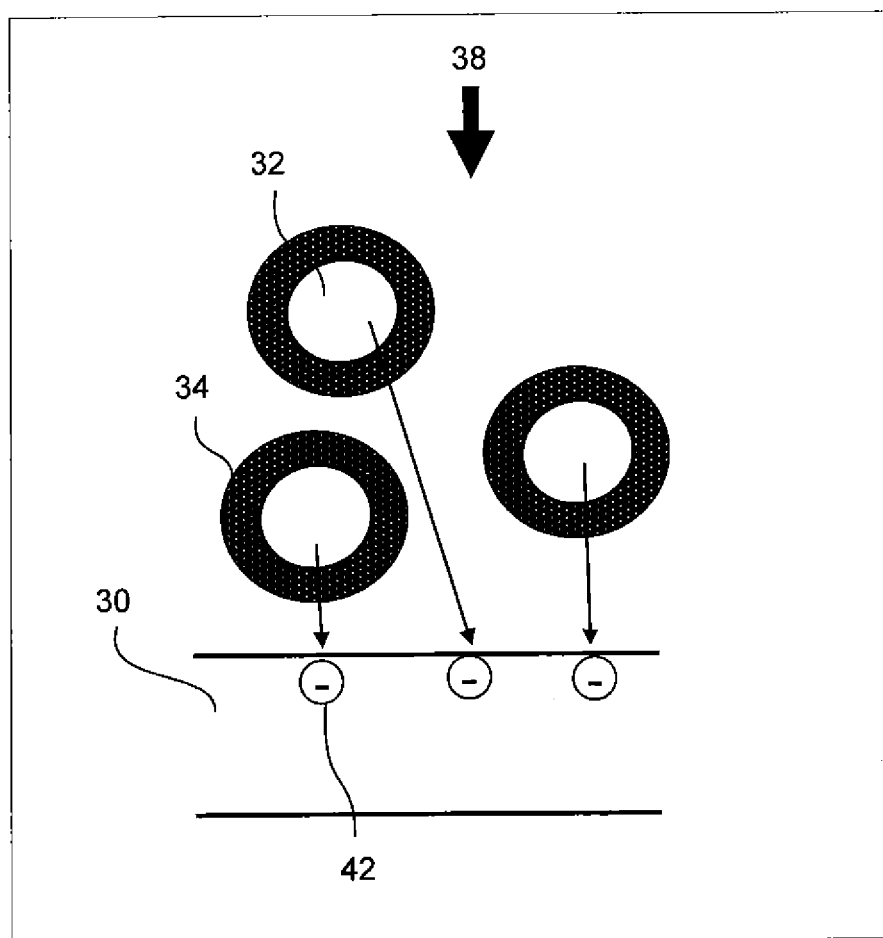
FIG. 4 is a view for explaining the behavior of electrons by the photoexcitation structural change.

FIG. 4 is a view schematically expressing the state that the titanium dioxide 32 covered with the silicone 34 has undergone the photoexcitation structural change by ultraviolet irradiation and the electron 42 has moved to the copper 30. The electron 42 has passed through the barrier made by the silicone 34 and moved to the copper 30 by the tunnel effect and stays due to a weak trapping force generated by the potential of the silicone 34.

Figure 5:
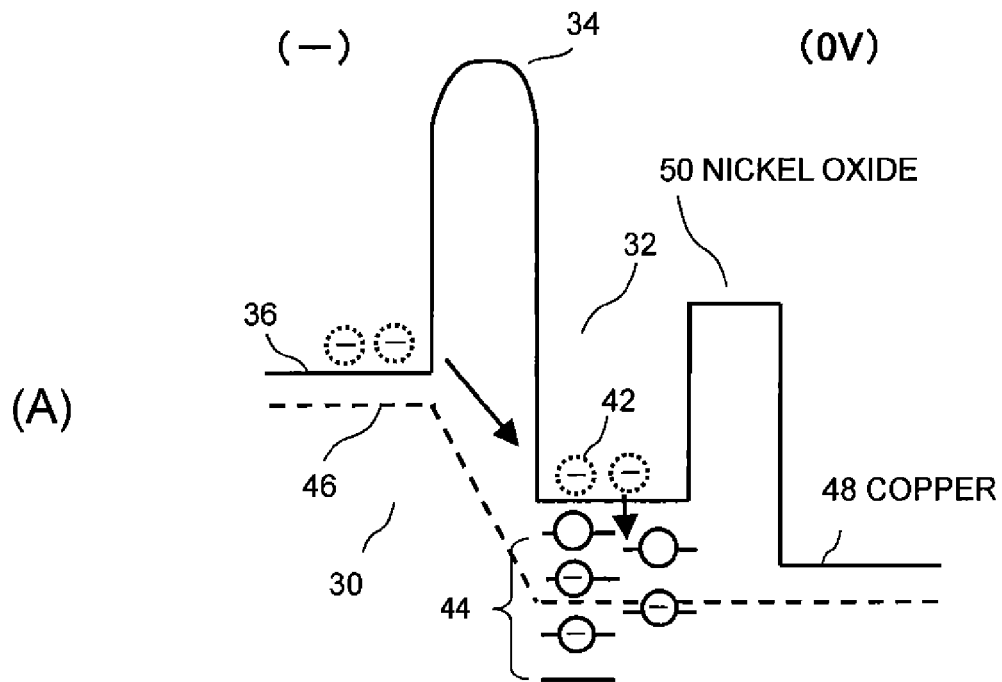
FIG. 5 is a band chart for explaining a charge/discharge function of the quantum battery.
Figure 5:
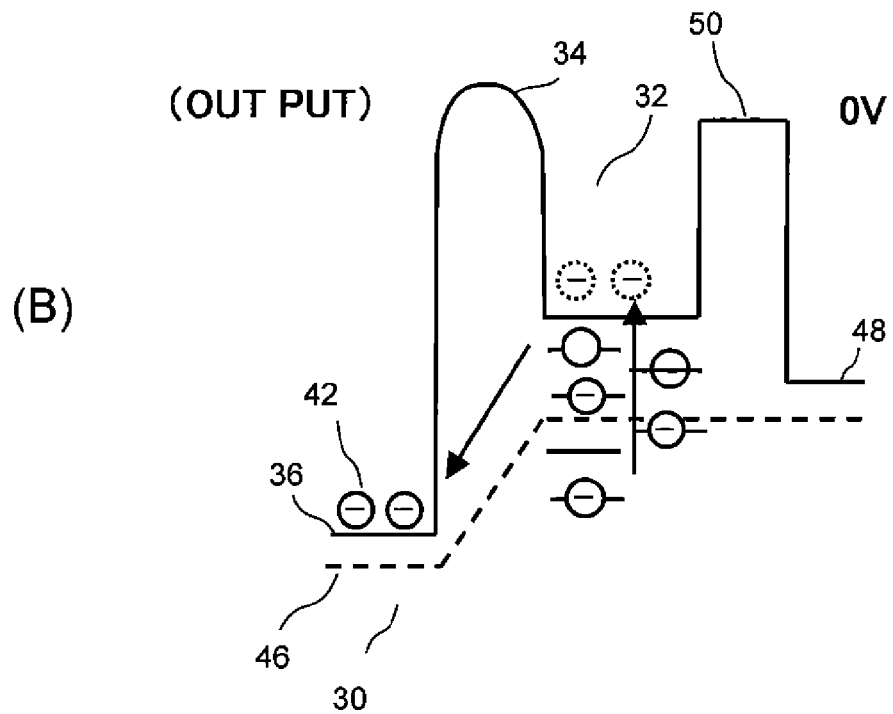

As the secondary battery, the p-type metal oxide semiconductor layer 16 is further stacked on the charge layer 14 to form a blocking layer, and the second electrode 18 is provided thereon. The principle of the secondary battery by the structure will be described in a band charge in FIG. 5.

FIG. 5(A) illustrates a band chart in the case where in the quantum battery 10 composed of the silicone 34 and the titanium dioxide 32 in the charge layer 14 and a nickel oxide 50 functioning as the p-type metal oxide semiconductor layer 16 which are sandwiched between the copper 30 constituting the first electrode 12 and a copper 40 constituting the second electrode 18, a minus voltage is applied to the copper 48 constituting the second electrode 18 and the copper 30 constituting the first electrode 12 is grounded to 0V.

When a bias electric field (−) to the titanium dioxide 32 having the energy levels 44 in the band gap, the electrons 42 in the copper 30 pass (tunnel) through the barrier made by the silicone 34 and move to the titanium dioxide 32. The moved electrons 42 are trapped by the energy levels 44 existing between the band gaps of the titanium dioxide 32 because further movement to the copper 48 is blocked by the nickel oxide 50, whereby energy is stored. That is a charge state in which the electrons 42 are filled in the charge layer 14. Since this state is maintained even after release of the application of the bias electric field, the quantum battery has the function as the secondary battery.

FIG. 5(B) illustrates a band chart in the case where a load (not illustrated) is connected to the copper 30 and the copper 48 to discharge. The electrons 42 trapped in the band gap become free electrons in the conduction band 36. The free electrons move to the copper 30 and flow to the load. This phenomenon is the output state of energy and is the discharge state. Finally, the band gap becomes into a state that there is no electron 42 in the energy levels 44 therein, namely, all energy is used.

As described above, the quantum battery serves as a secondary battery by applying voltage from the outside to the energy levels formed in the band gap of titanium dioxide, namely, the intermediate band, to form an electric field so as to fill electrons therein, and connecting the load to the electrodes to release the electrons so as to extract energy. By repeating this phenomenon, the quantum battery can be used as the secondary battery.

For manufacture of the quantum battery 10, the substrate 11 is used which is made by stacking a polyimide film having a thickness of about 4 μm on a glass plate. A usual first electrode 12 in a flat plate shape is made by stacking 50 nm of chromium having passive characteristics, 300 nm of copper, and 50 nm of chromium are on the substrate 11. Examples of the method of forming the layers include sputtering, ion-plating, and vapor-phase film forming methods such as electron beam deposition, vacuum deposition, chemical vapor deposition and the like. Further, the metal electrode can be formed by the electrolytic plating method, the electroless plating method and the like.

Next, the charge layer 14 is formed by mixing the titanium dioxide 32 made into fine particles into a silicone liquid and performing spin coating of the mixture on the first electrode 12 to form a thin layer of 1000 nm or more, and then baking the resultant at about 300° C. At this stage, the charge layer 14 is irradiated with ultraviolet rays, whereby the titanium dioxide 32 undergoes the photoexcitation structural change to form a new intermediate band.

Thereafter, 150 nm of nickel oxide as the p-type metal oxide semiconductor layer 16 is further stacked, and 300 nm of copper as the second electrode 18 and 50 nm of chromium as the passive layer 19 are stacked to manufacture the quantum battery 10.

In the manufacture of the quantum battery, heating in a baking process is a cause of occurrence of cracks in the first electrode. The linear expansion coefficient due to heat is 9.9 ppm/° C. in glass, 46 ppm/° C. in polyimide, 6.2 ppm/° C. in chromium, and 16.6 ppm/° C. in copper. As compared with chromium and copper, the linear expansion coefficient of polyimide is an extremely large value.

Figure 6:
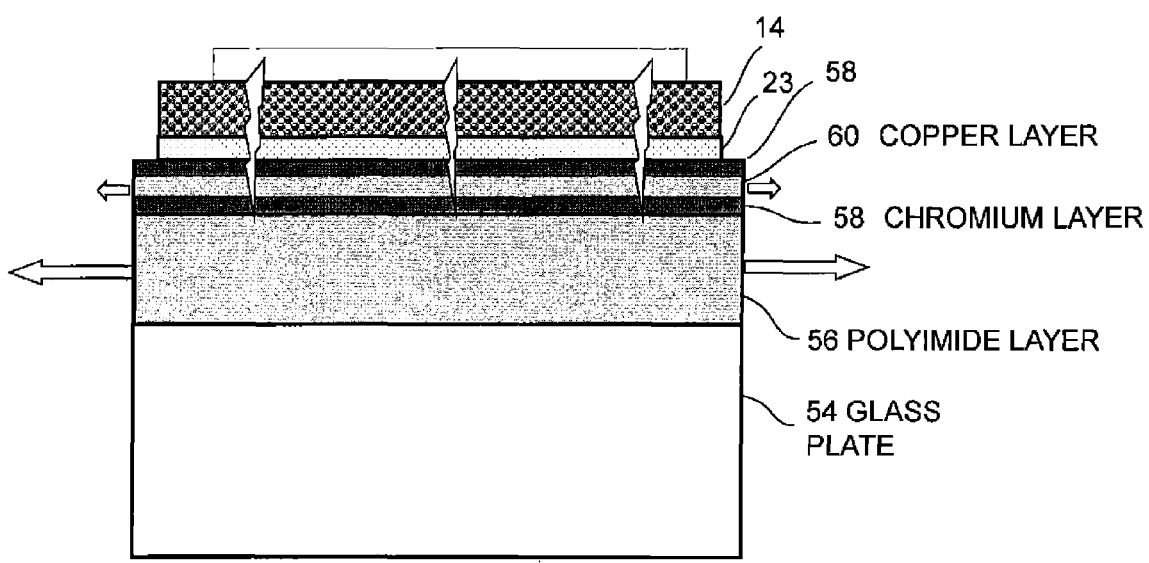
FIG. 6 is a conceptual view for explaining a cause of occurrence of cracks.

FIG. 6 is a schematic view explaining the state where cracks occur due to heating in the baking process of the charge layer 14. In FIG. 6, a polyimide layer 56 is formed on a glass plate 54, a chromium layer 58 as the passive layer is stacked with a copper layer 60 intervening therebetween, and the charge layer 14 is further formed by spin coating. When the resultant is heated to high temperature in this state, the polyimide layer 56 and the metal electrode (the chromium layer 58 and the copper layer 60) thermally expand in a direction of arrows illustrated in FIG. 6. Since the linear expansion coefficient of polyimide is much larger than those of chromium and copper, a large tensile force is applied to the metal electrode, and when the force exceeds the limit, cracks occur. Along with this, cracks occur also in the charge layer 14.

Figure 7:
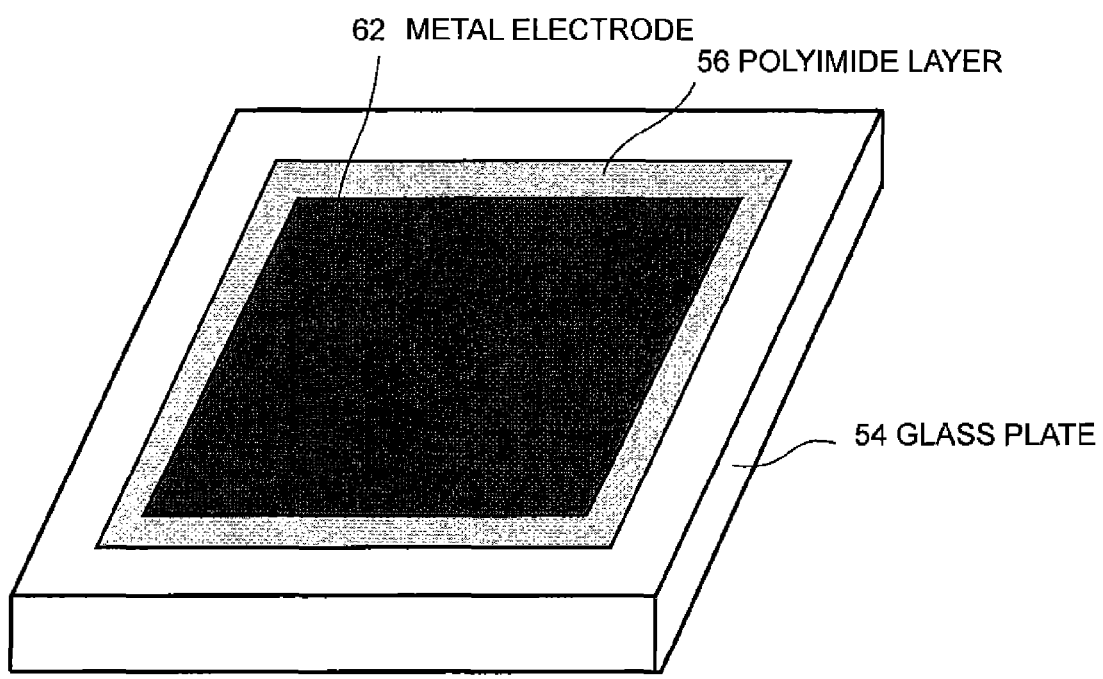
FIG. 7 is a sample for investigating the state of occurrence of cracks in an electrode.

FIG. 7 is a sample made by stacking, on the glass plate 54, a metal electrode 62 composed of a copper layer having a thickness of 300 nm sandwiching the polyimide layer 56 having a thickness of 4 µm and a chromium layer having a thickness of 50 nm from both sides. This sample was heated to 300° C. in a heating furnace and cooled to room temperature and then taken out.

Figure 8:
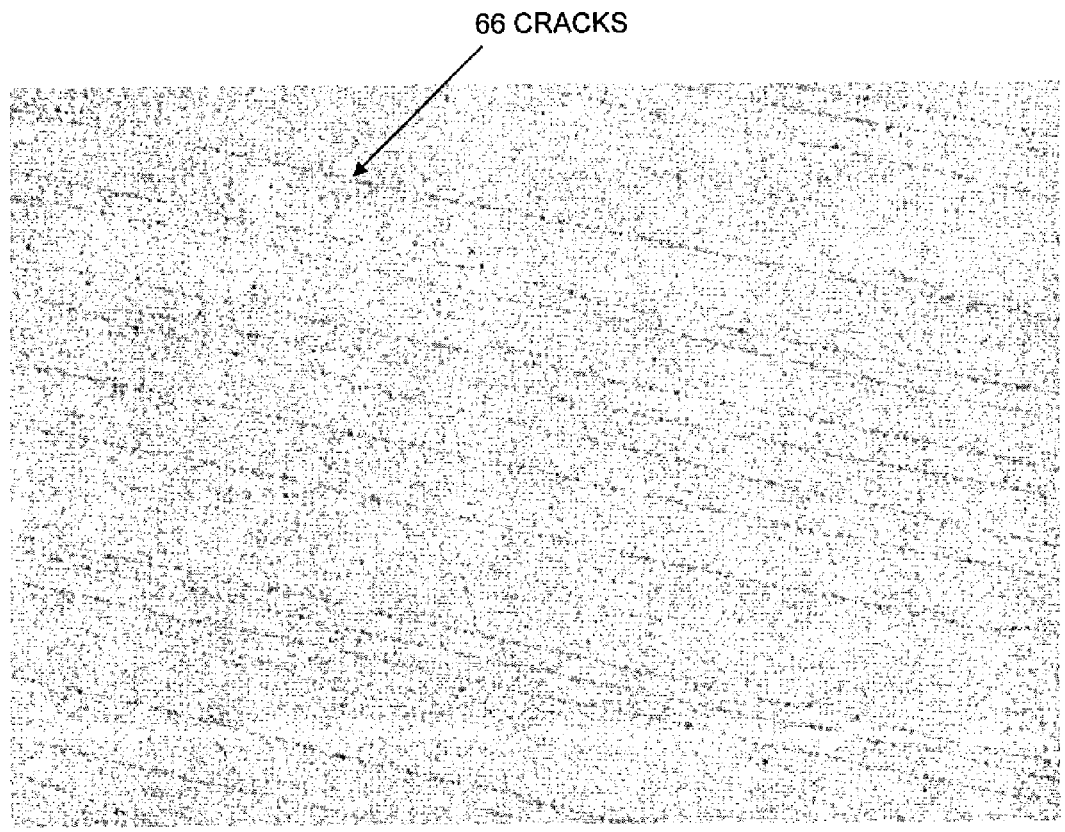
FIG. 8 is a view illustrating cracks occurred in the electrode.

FIG. 8 is a surface state 64 of the metal electrode 62 in the sample. As is clear from FIG. 8, many cracks occurred. The cracks occurred in the entire electrode surface.

The reason of occurrence of the cracks 66 is that a tensile force is generated due to the big difference in thermal expansion between two superposed materials so that the metal electrode which cannot withstand the stress any longer tears.

Hence, it was to be discussed what displacement and stress occur due to different thermal expansion, from analysis using the finite element method.

Figure 9:
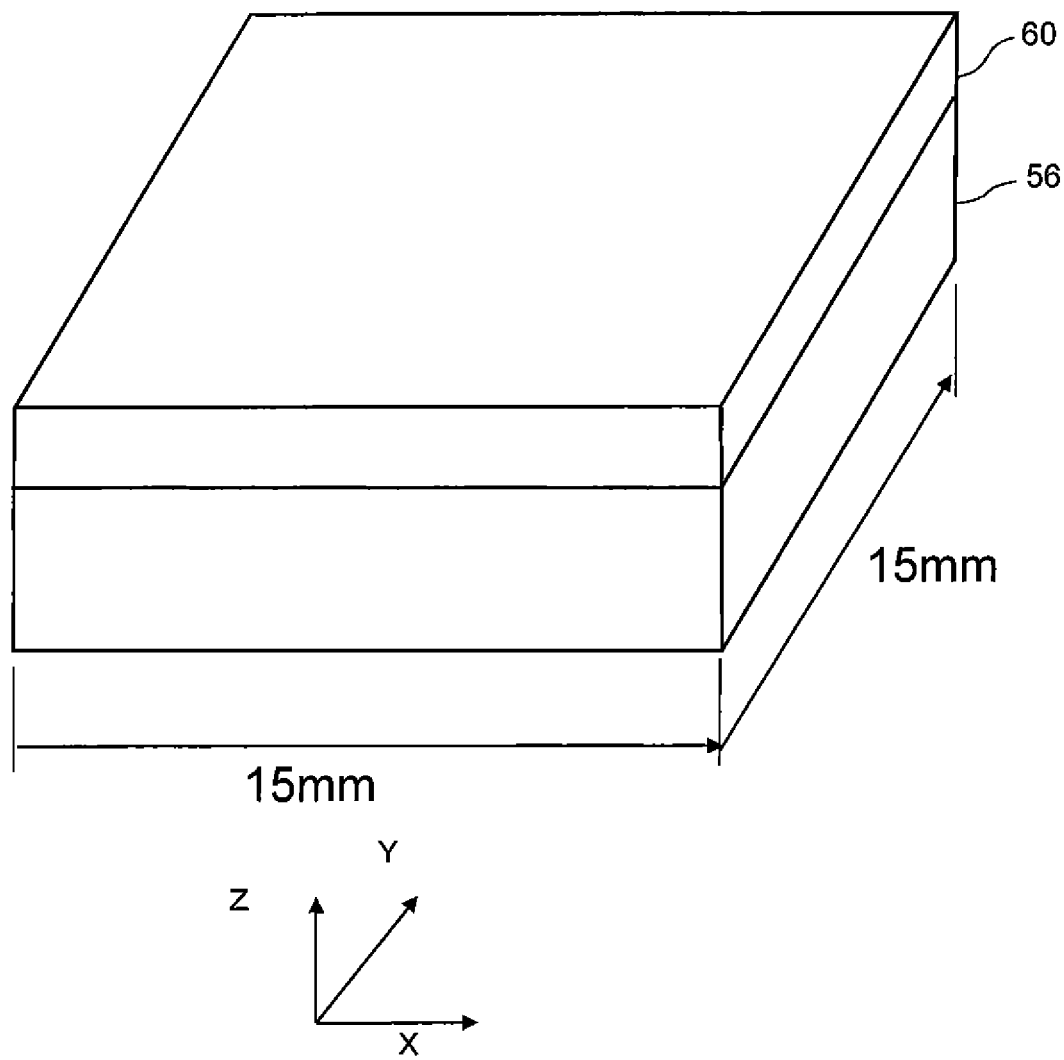
FIG. 9 is a model for analyzing displacement and stress due to a difference in thermal expansion coefficient.

FIG. 9 illustrates an analysis model. The analysis model is a rectangular stacked plate composed of the polyimide layer 56 and the copper layer 60 and has a thickness in X- and Y-axis directions of 15 mm. This analysis model is a linear viscoelastic model, and its thermal deformation and Mises stress are calculated by applying the Maxwell model and taking into account the thermal expansion coefficient.

In the analysis, the stacked plate is isotropic and uniform in an in-plane direction, causes no stress in a direction vertical to the plane, receives no constraint, and warps by application of a uniform temperature distribution thereto. The entire warp is obtained by independently considering the strain of each layer and considering the interfaces between the layers continue.

Figure 10:
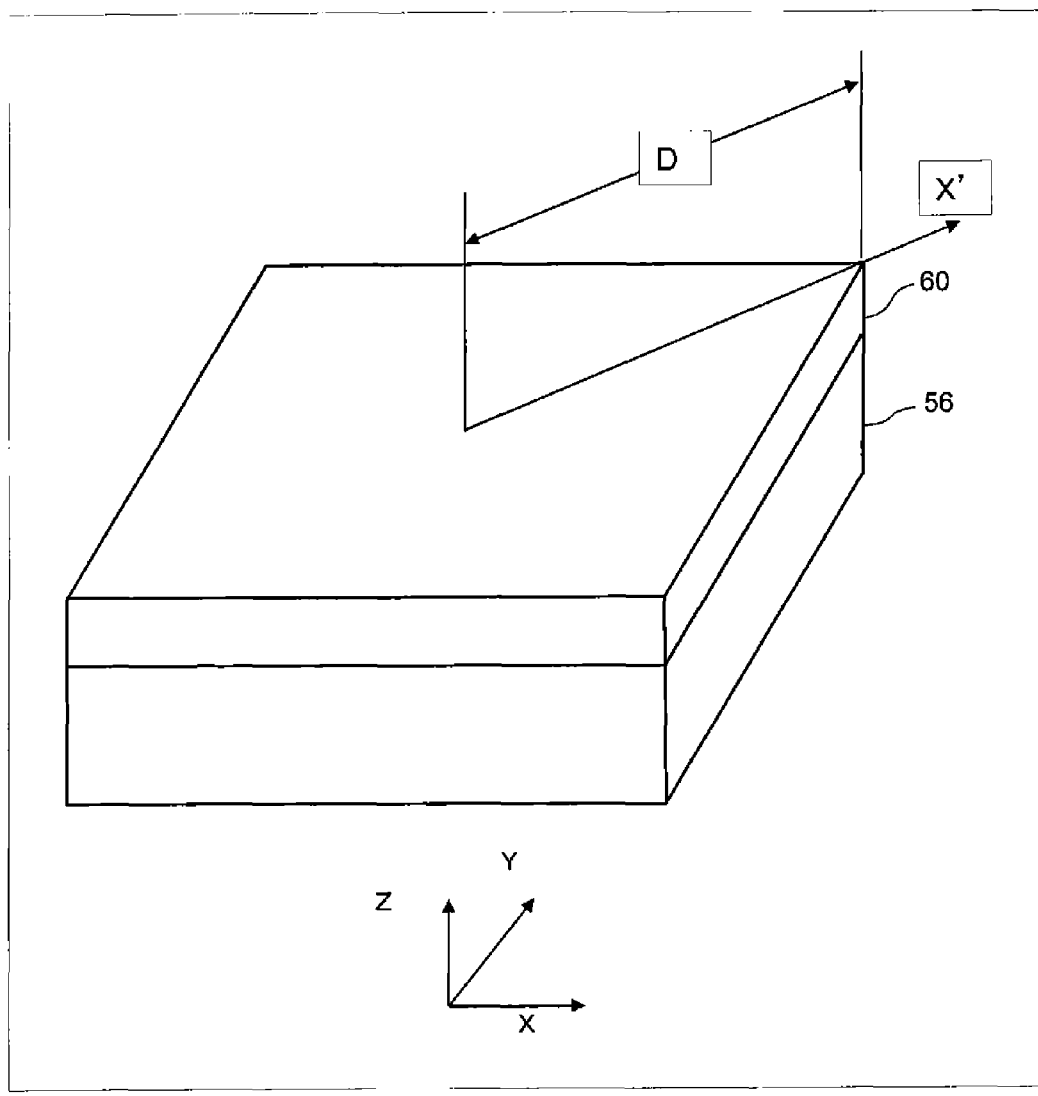
FIG. 10 is an explanatory view in a diagonal direction for analyzing the displacement and stress due to the difference in thermal expansion coefficient.
Figure 11:
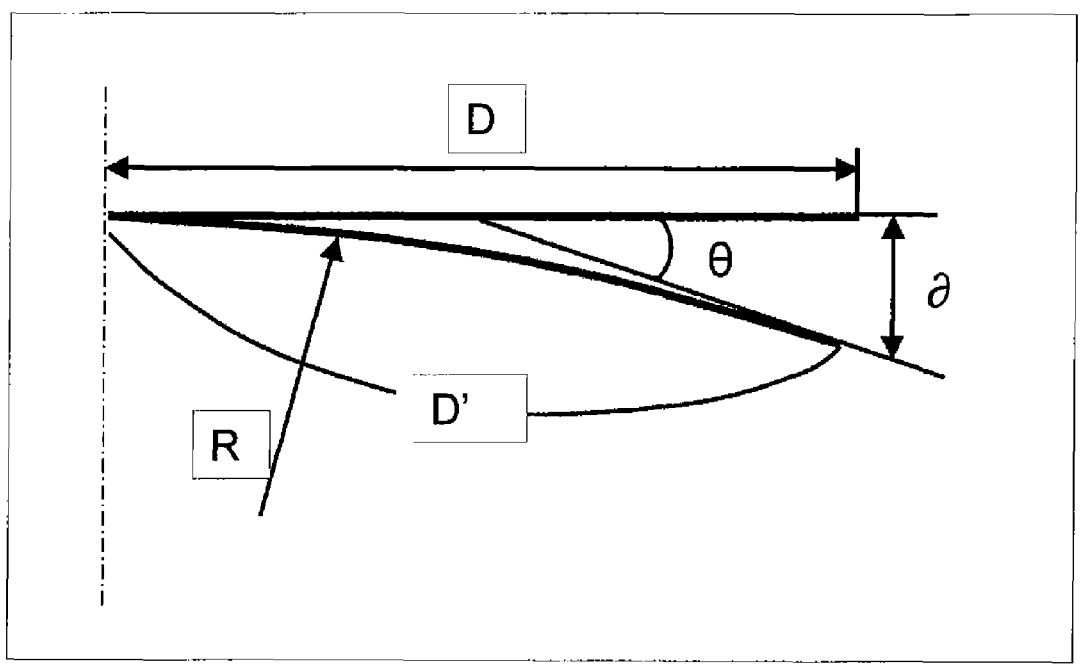
FIG. 11 is a view for explaining the displacement of the analysis model.

The strain occurring in each layer is thermal strain, strain due to the force in the in-plane of the plate, and strain due to the moment of the plate. Further, because of the isotropic and no constraint conditions, its curvature is equal in all directions in an xy-plane. When the distance from the center of the stacked plate to the corner is D as illustrated in FIG. 10 and the cross section on this line is considered as that in FIG. 11, and where the radius of curvature is expressed by R, the inclination at the tip of the stacked plate is expressed by $\theta$ and D=D' if $\theta$ is small, a maximum deflection $\delta$ is obtained.

As the analysis of the finite element method, the "heat warp simple evaluation program of a viscoelastic laminated plate" produced by Mechanical Design Co., Ltd. was used. The Poisson's ratio of polyimide was set to 0.30 and that of copper was set to 0.34, and the linear expansion coefficient of polyimide was set to 46 ppm/° C. and that of copper was set to 16.6 ppm/° C. The thickness of polyimide was set to 4 µm and that of copper was set to 300 nm.

Figure 12:
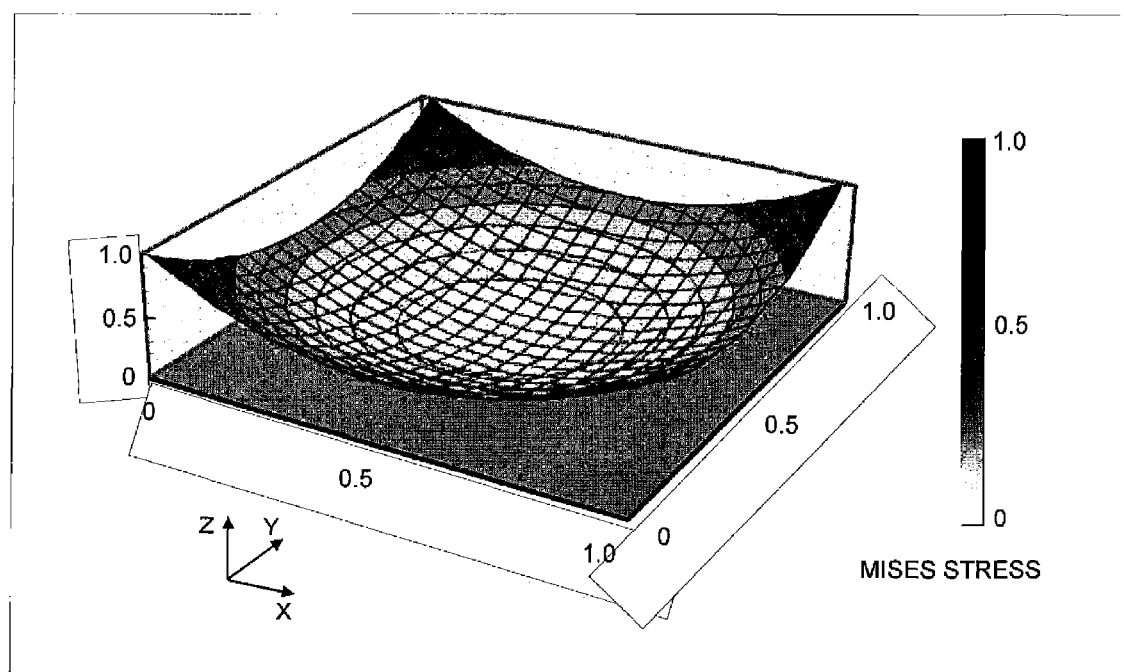
FIG. 12 is an analysis result by the finite element method.

FIG. 12 illustrates the analysis result when the temperature was set to 300° C. What is important in the analysis is the distribution state of the displacement and the Mises stress, and the displacement in a Z-axis direction was normalized by a maximum displacement $\partial$ using the center point as 0 and the Mises stress was also normalized by its maximum value. Further, the lengths in the X- and Y-axis directions are also normalized and indicated.

The analysis result shows that the displacement has a distribution in a concentric pattern from the center point of the rectangular stacked plate and rapidly becomes larger with distance from the center point. Along with this, the Mises stress also rapidly becomes larger in value with distance from the center point of the rectangular stacked plate.

Figure 13:
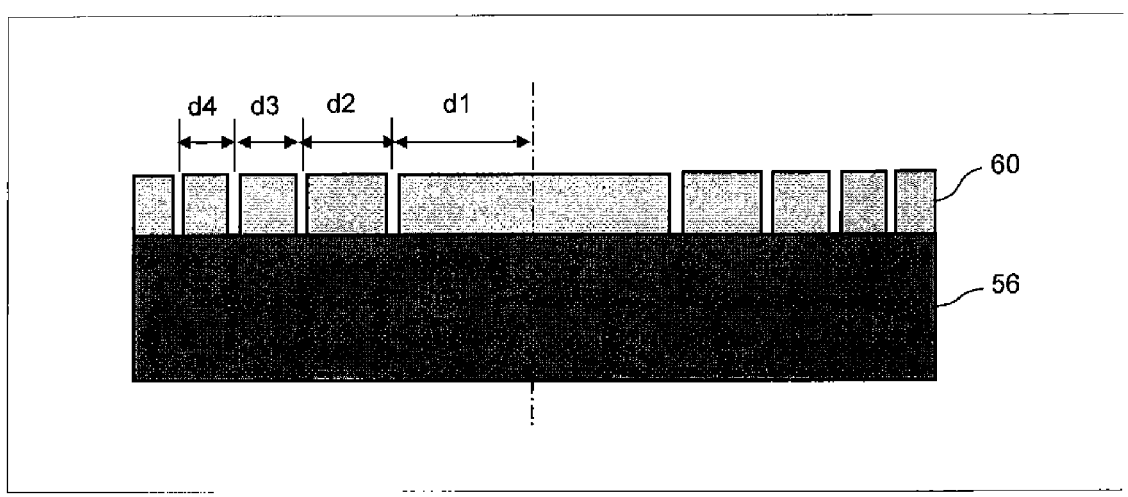
FIG. 13 is a view for explaining positions of slits on the basis of the analysis result.

FIG. 13 illustrates effective positions of slits that disperse the stress in the electrode on the basis of the analysis result illustrated in FIG. 12. It is found that the stress rapidly becomes larger in value with distance from the center of the stacked plate, so that when the positions of the slits from the center portion are d1, d2, d3, d4 as illustrated in FIG. 13, it is effective to set d1>d2>d3>d4. The electrode to be divided by the slits is divided so that the tensile strength becomes equal to or less than the proof stress that the electrode can withstand.

The electrodes divided by the slits is called a main electrode. Since the charge layer in gap portions generated by the slits in the main electrode does not function as the charge layer, an auxiliary electrode is provided which covers the slits in the main electrode to prevent generation of gaps in the entire electrode surface. What is obtained by combining the main electrode and the auxiliary electrode is the slit electrode. In the slit electrode, the slits only need to be formed so that the tensile strength becomes equal to or less than the proof stress, and various patterns are considered and will be described below.

Figure 14:
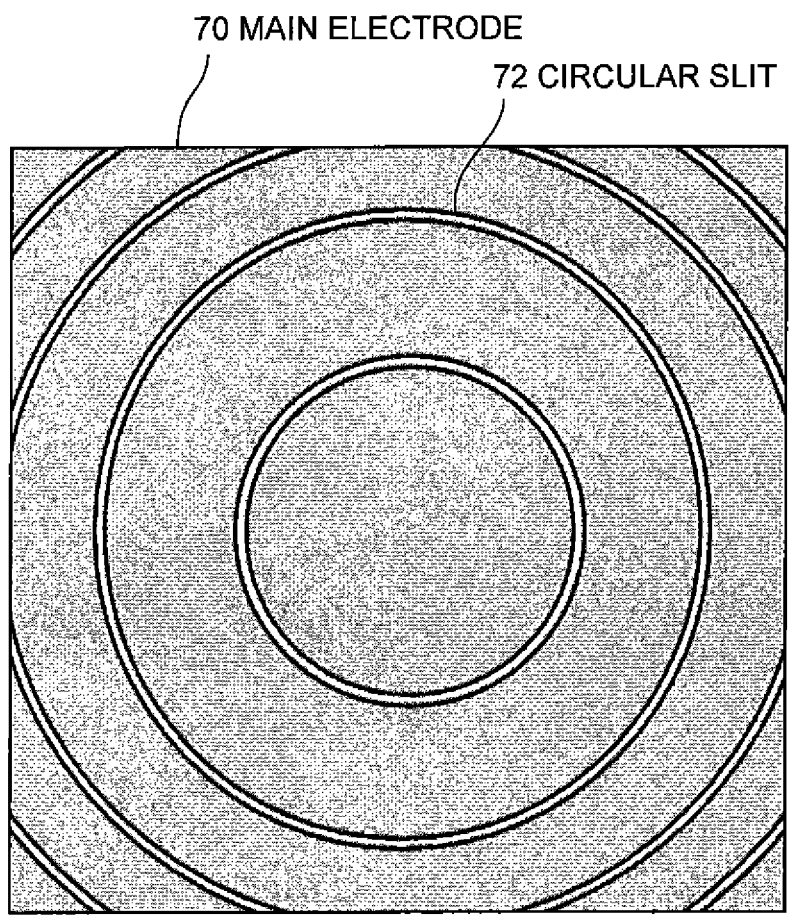
FIG. 14 is a view illustrating circular slits in a main electrode.

FIG. 14 is an example in which a circular slit pattern is provided in the main electrode. The slit width of the circular slit pattern provided in a main electrode 70 only needs to be about 10 to 100 µm and may be more larger. There is no limit on the width of the slit, and it is only necessary that the electrode is separated by the slits. Circular slits 72 are formed concentrically from the center point of the rectangular electrode, and the interval between the circular slits 72 is made narrower with distance from the center point.

Figure 15:
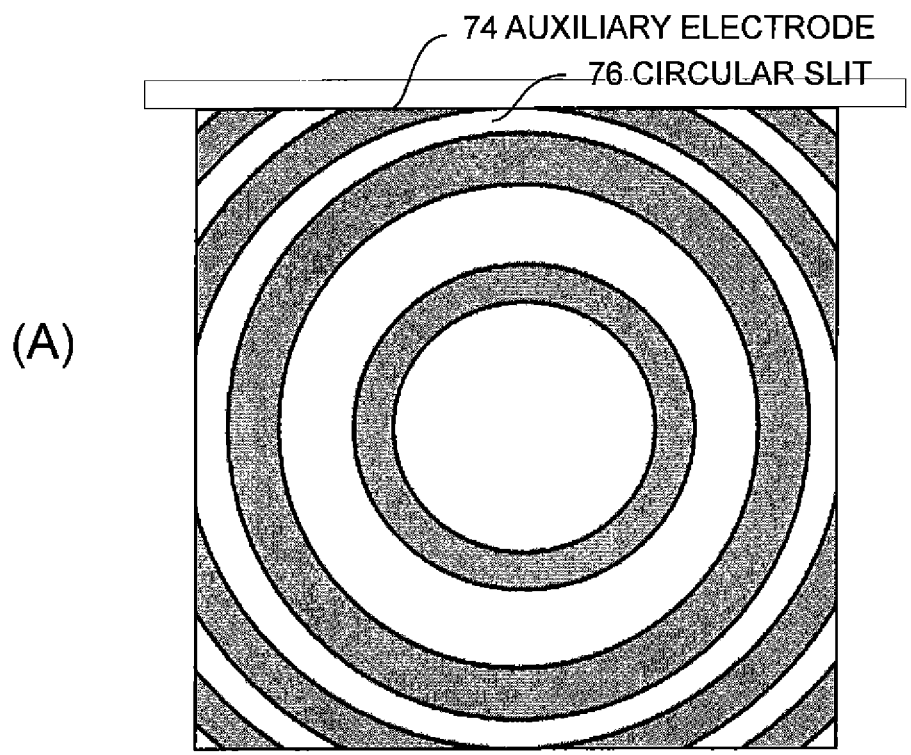
FIG. 15 is a view illustrating circular slits in an auxiliary electrode.
Figure 15:
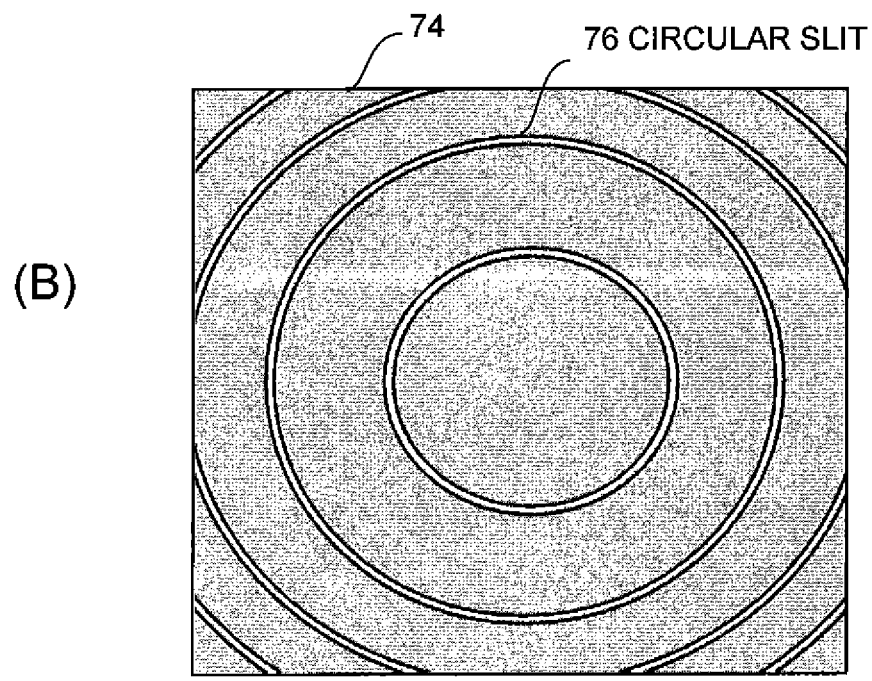

FIG. 15 is a circular slit pattern in the auxiliary electrode for covering slit portions of the circular slit pattern illustrated in FIG. 14. FIG. 14(A) is an auxiliary electrode 74 provided with circular slits 76, in which the slit width is made wider and only electrode portions enough to cover the slit portions of the main electrode 70 are left. FIG. 14(B) is an example in which circular slits 76 similar to those of the main electrode are provided at positions not overlapping with the slits in the main electrode 70.

Figure 16:
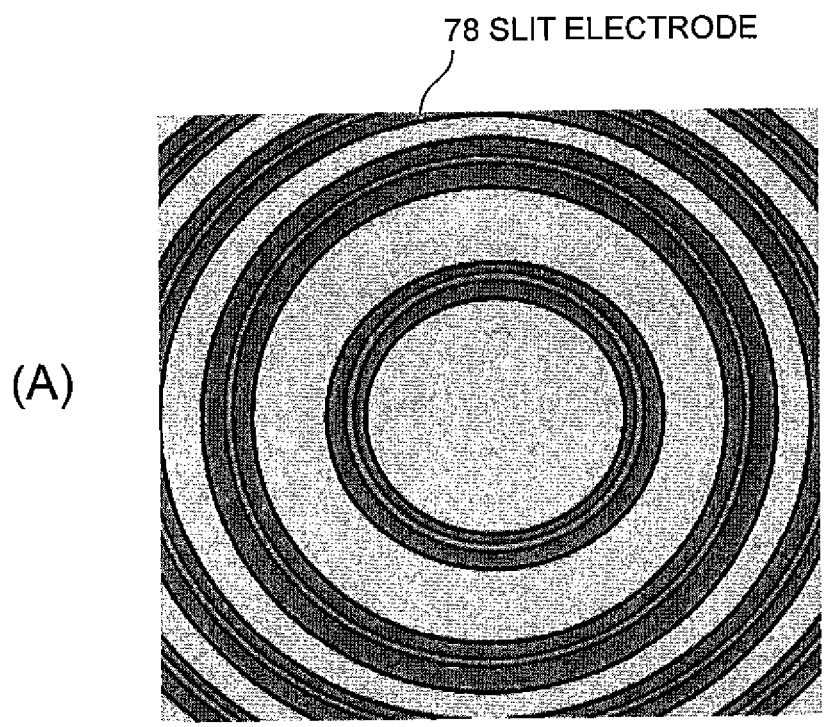
FIG. 16 is a view illustrating an electrode structure provided with slits made by superposing the main electrode and the auxiliary electrode which are provided with circular slits.
Figure 16:
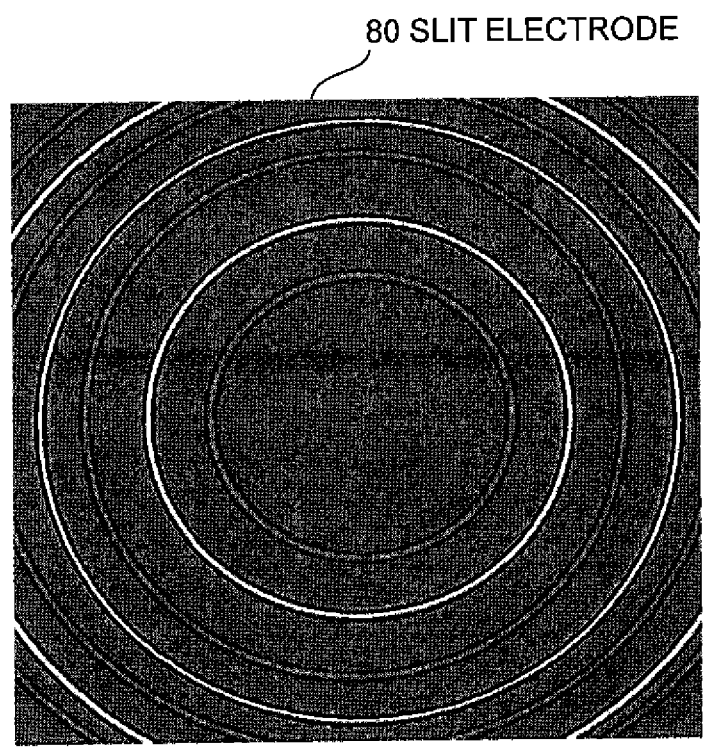

FIG. 16 is a slit electrode made by stacking the auxiliary electrode 74 illustrated in FIG. 15 on the main electrode 70 provided with the circular slits 72 illustrated in FIG. 14. FIG. 16(A) is a slit electrode 78 made by stacking the auxiliary electrode 74 in FIG. 15(A), and FIG. 16(B) is a slit electrode 80 made by stacking the auxiliary electrode 74 in FIG. 15(B). As described above, it is only necessary the slit portions of the main electrode 70 are covered by the auxiliary electrode 74, and the auxiliary electrode 74 also always needs slits because it receives the stress due to the thermal expansion of polyimide.

Figure 17:
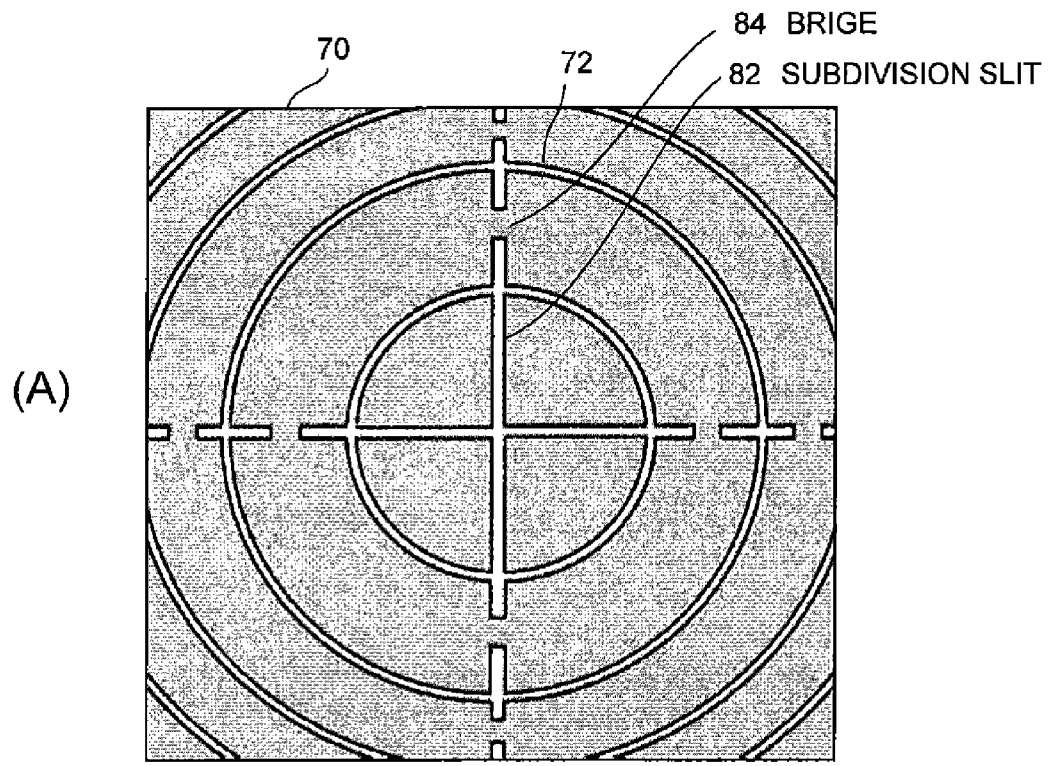
FIG. 17 is a view of the electrodes divided by the slits, which are further divided by subdivision slits.
Figure 17:
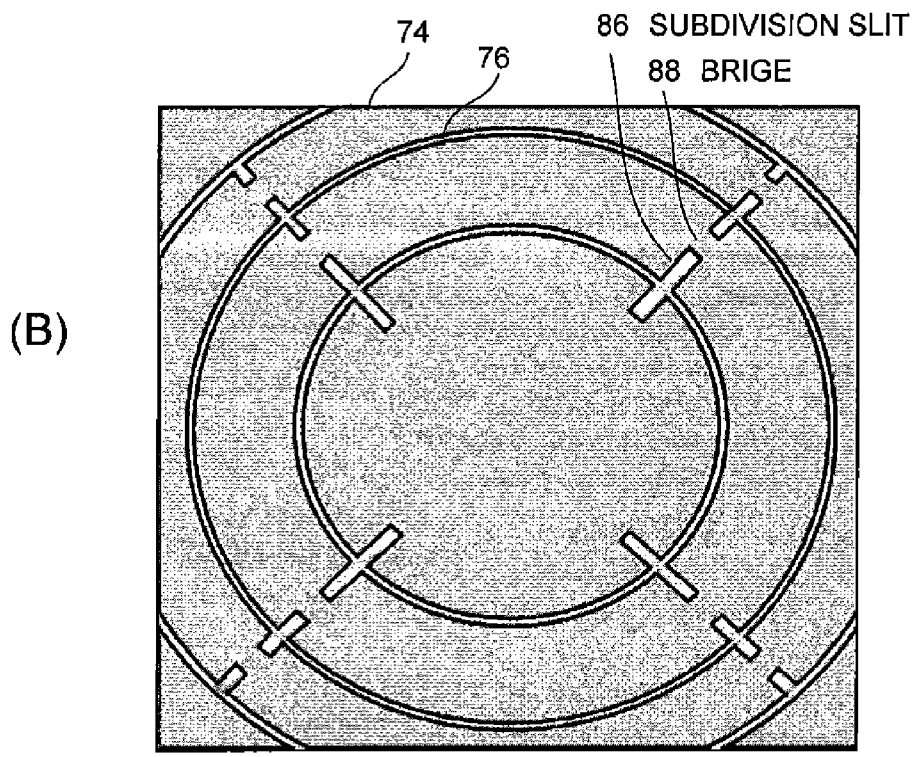

In FIG. 17, the electrodes divided by the circular slits 72, 76 illustrated in FIGS. 14 and 15 are further divided to distribute the stress on the electrodes. FIG. 17(A) illustrates a slit pattern of the main electrode 70. Subdivision slits 82 are slits in the longitudinal direction and the lateral direction passing through the central portion of the main electrode, and portions thereof overlapping with the circular slits 76 in the auxiliary electrode are provided with bridges 84 by eliminating the slits. FIG. 17(B) illustrates a slit pattern of the auxiliary electrode 74. Subdivision slits 86 are slits in the diagonal line directions of the auxiliary electrode 74, and portions thereof overlapping with the circular slits 72 in the main electrode are provided with bridges 88 by eliminating the slits.

Figure 18:
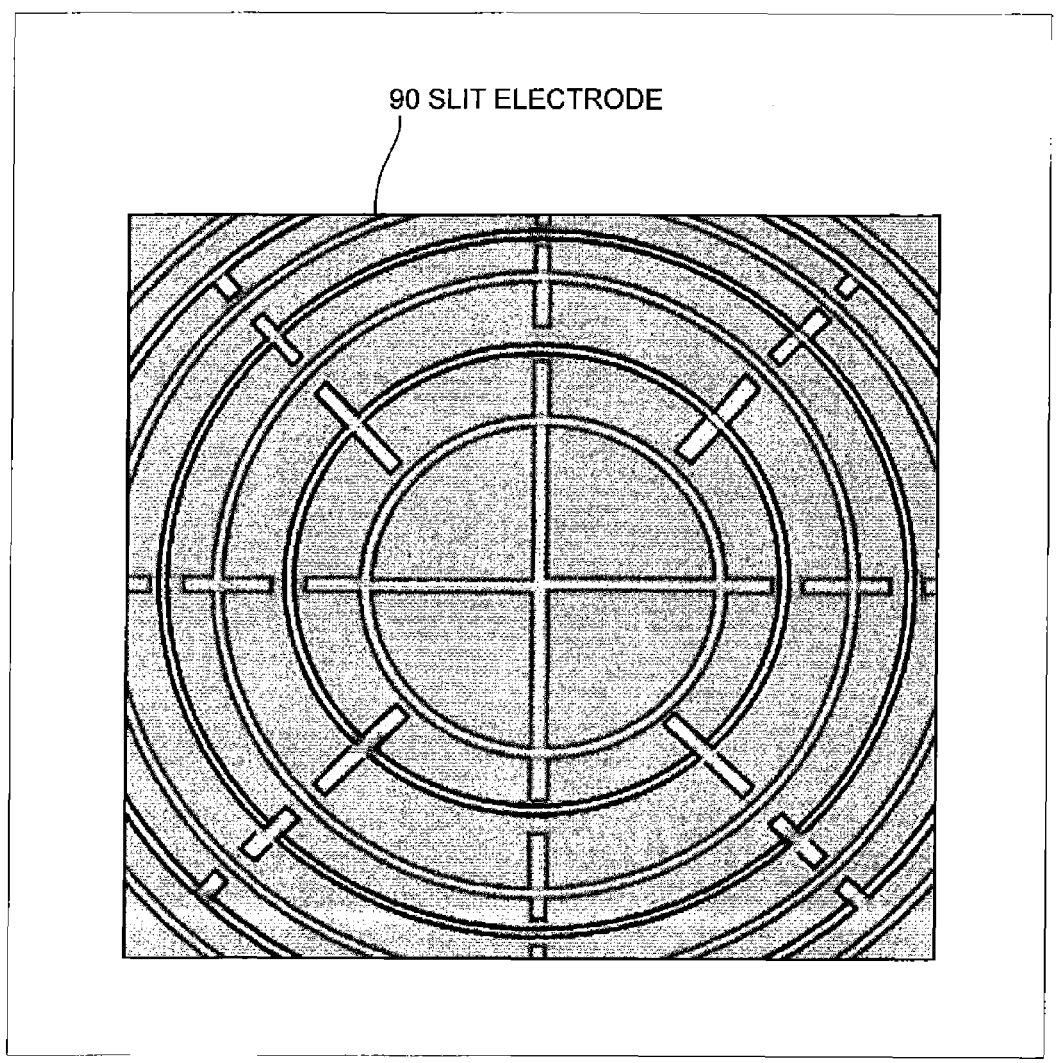
FIG. 18 is a view illustrating an electrode structure provided with slits made by superposing the main electrode and the auxiliary electrode in which the circular slits are provided with the subdivision slits.

FIG. 18 is a slit electrode 90 produced by superposing the main electrode 70 provided with the subdivision slits 82 and the auxiliary electrode 74 provided with the subdivision slits 86. Because the electrodes divided by the subdivision slits 82, 86 are provided with the bridges 84, 86, the electrodes cover the entire charge layer to eliminate portions being gaps when they are overlapped with each other.

Figure 19:
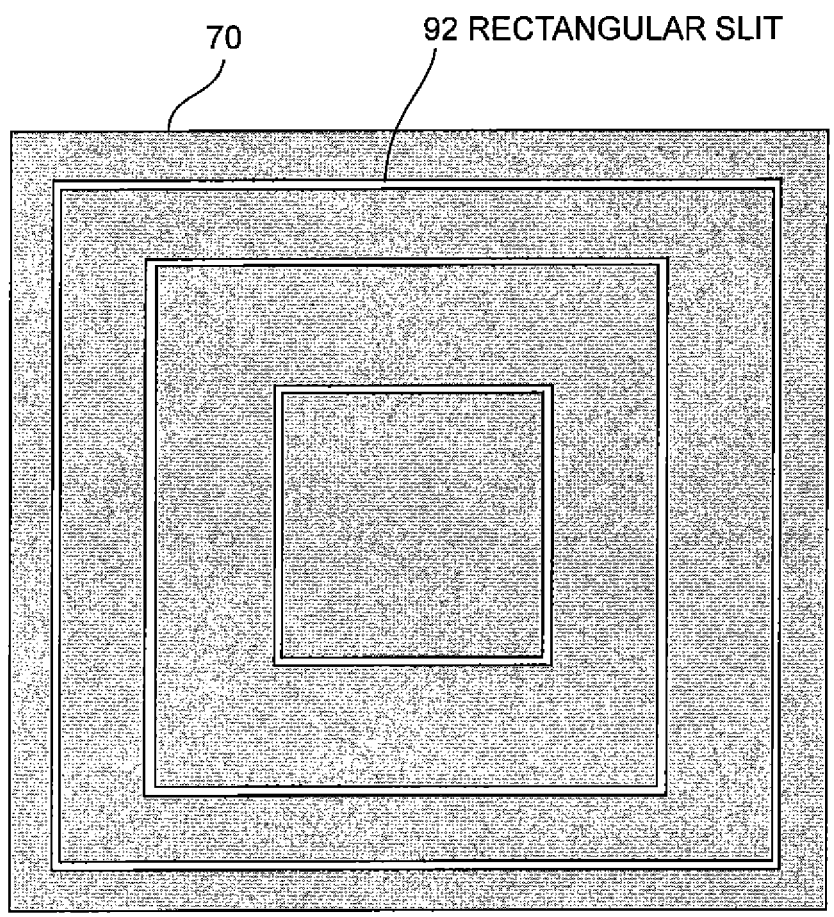
FIG. 19 is a view illustrating the main electrode provided with rectangular slits.
Figure 20:
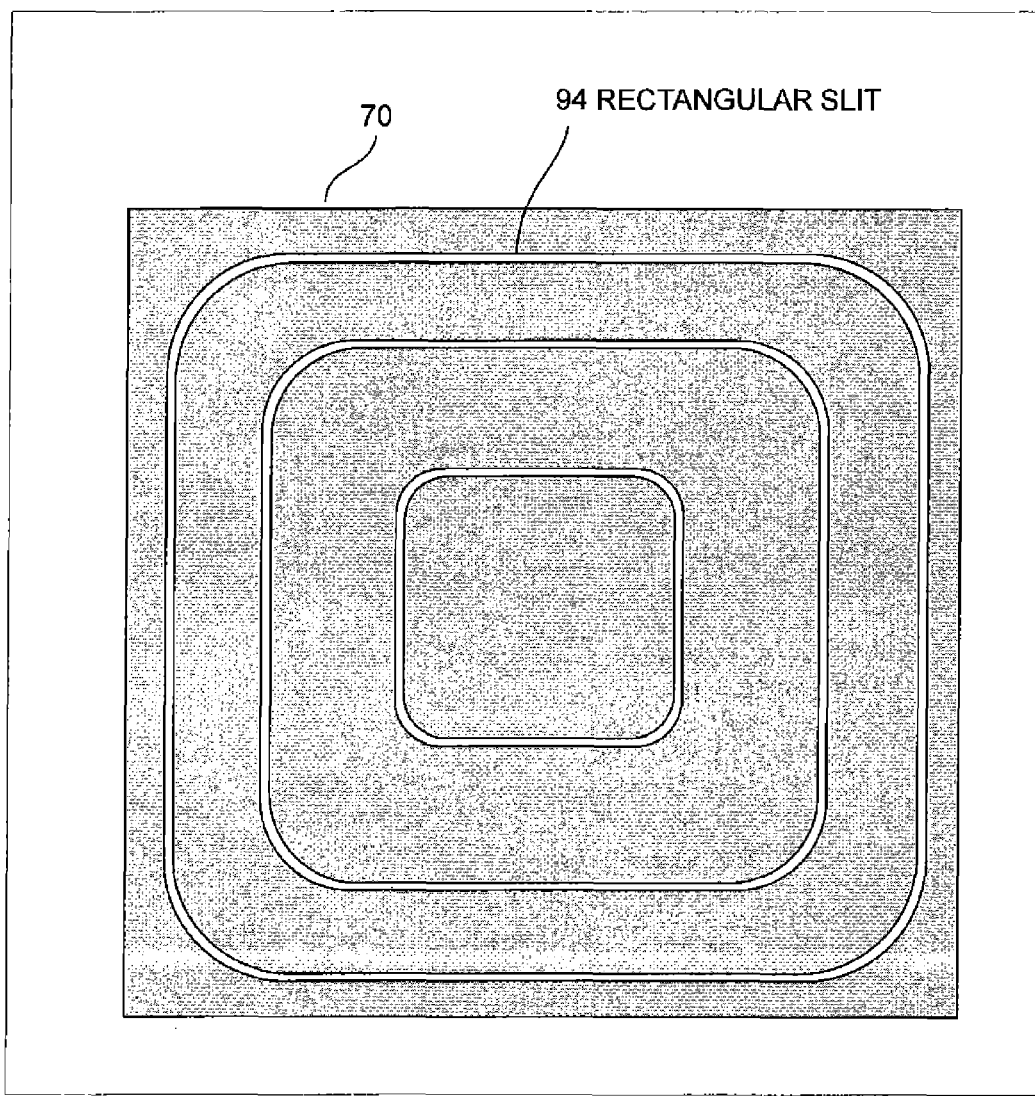
FIG. 20 is a view illustrating the main electrode provided with rectangular slits having rounded corners.

The pattern divided by the slits in the main electrode is not limited to the circle but may be formed in various conceivable shapes. As an example, rectangular slits 92 are illustrated in FIG. 19, and rectangular slits 94 made by rounding corner portions of the rectangular slits 92 illustrated in FIG. 19 are illustrated in FIG. 20. This is because the corner portions are rounded to relieve concentration of the stress in the same electrode pattern. There are other conceivable slit patterns in polygonal and elliptical shapes without limitation in shape.

The structure in which the electrode is divided by slits against the stress from the central portion of the electrode surface has been described based on the analysis result so far, in which the slit shape of the auxiliary electrode is provided according to the idea of covering the gap portions generated by the formation of the slits in the main electrode. However, in this case, to form the two slit patterns of the main electrode and the auxiliary electrode in the manufacturing process of the electrode, different mask patterns need to be prepared respectively and become a factor in increasing the cost.

Therefore, making the slit patterns of the main electrode and the auxiliary electrode the same makes it possible to suppress the cost owing to use of the same pattern. Further, by forming the electrodes by the same film forming technique, for example, the sputtering method, the deposition method, the screen printing method or the like, further cost effect can be achieved.

Figure 21:
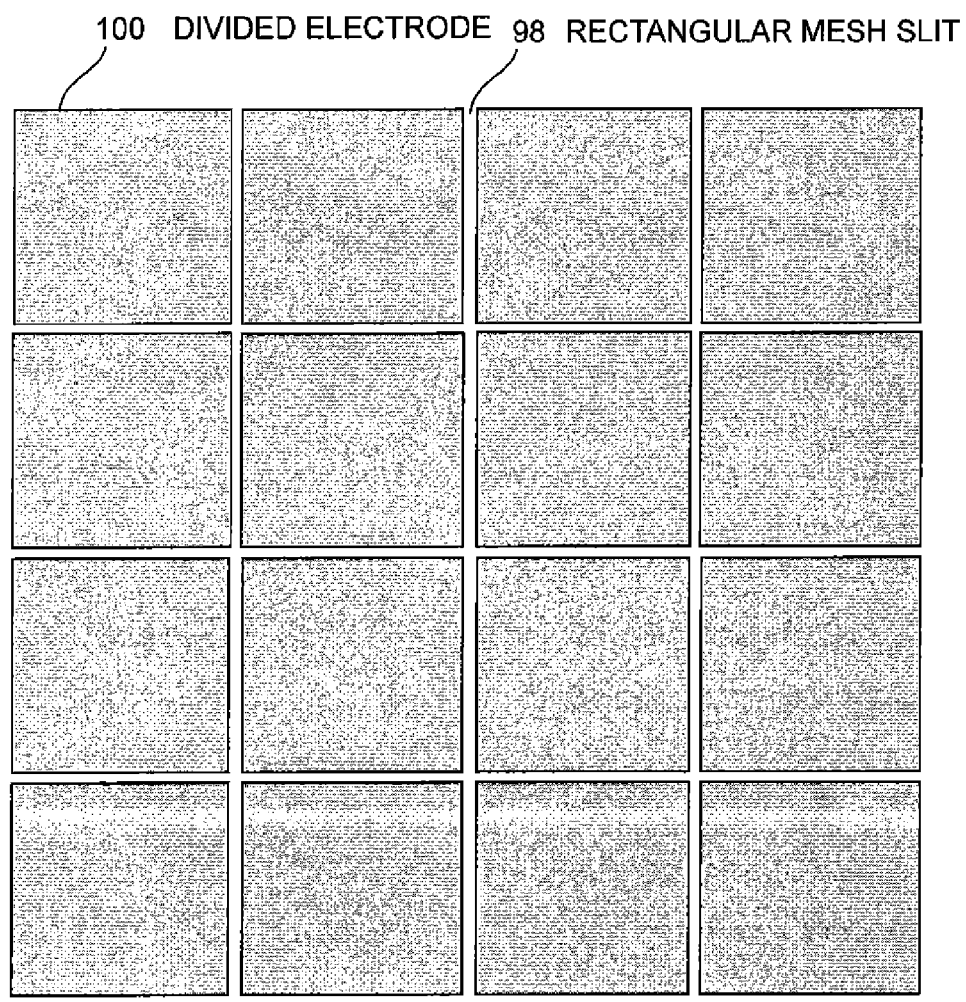
FIG. 21 is a view illustrating a rectangular mesh slit electrode pattern A for the electrode divided into rectangular shapes by rectangular mesh slits.

FIG. 21 is a rectangular mesh slit electrode pattern A 96 for forming the same slits for the main electrode and the auxiliary electrode. The electrode is in a structure in which it is divided into rectangular shapes by rectangular mesh slits 98 in a mesh shape so that divided electrodes 100 are arranged. In any region of the divided electrodes 100, occurrence of cracks in the electrode can be suppressed when the tensile strength is equal to or less than the proof stress.

Figure 22:
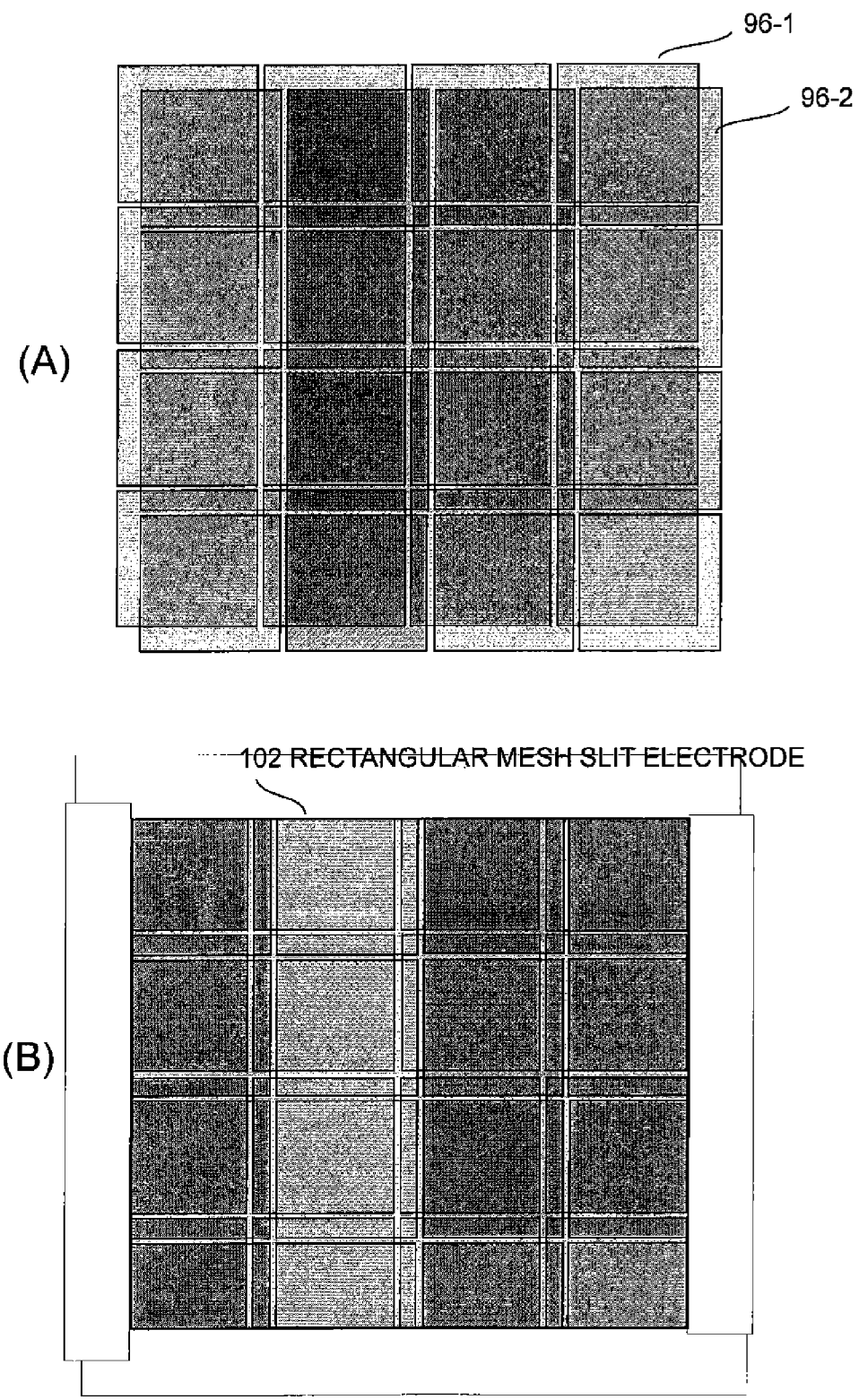
FIG. 22 is a view for explaining a rectangular mesh slit electrode made by superposing the main electrode and the auxiliary electrode with their positions displaced from each other using the same rectangular mesh slit electrode patterns A.

FIG. 22 is an explanatory view of manufacturing a slit electrode by forming slits in the main electrode and the auxiliary electrode by the rectangular mesh slit electrode pattern A 96 illustrated in FIG. 21. FIG. 22(A) illustrates the state that same rectangular mesh slit electrode patterns A 96-1, 96-2 are superposed one on the other with the slit positions of the main electrode and the auxiliary electrode displaced from each other. FIG. 22(B) is a rectangular mesh slit electrode 102 in which the main electrode and the auxiliary electrode are produced with the same rectangular mesh slit electrode patterns A 96-1, 96-2 explained in FIG. 22(A) displaced to positions where their slits do not overlap with each other.

Figure 23:
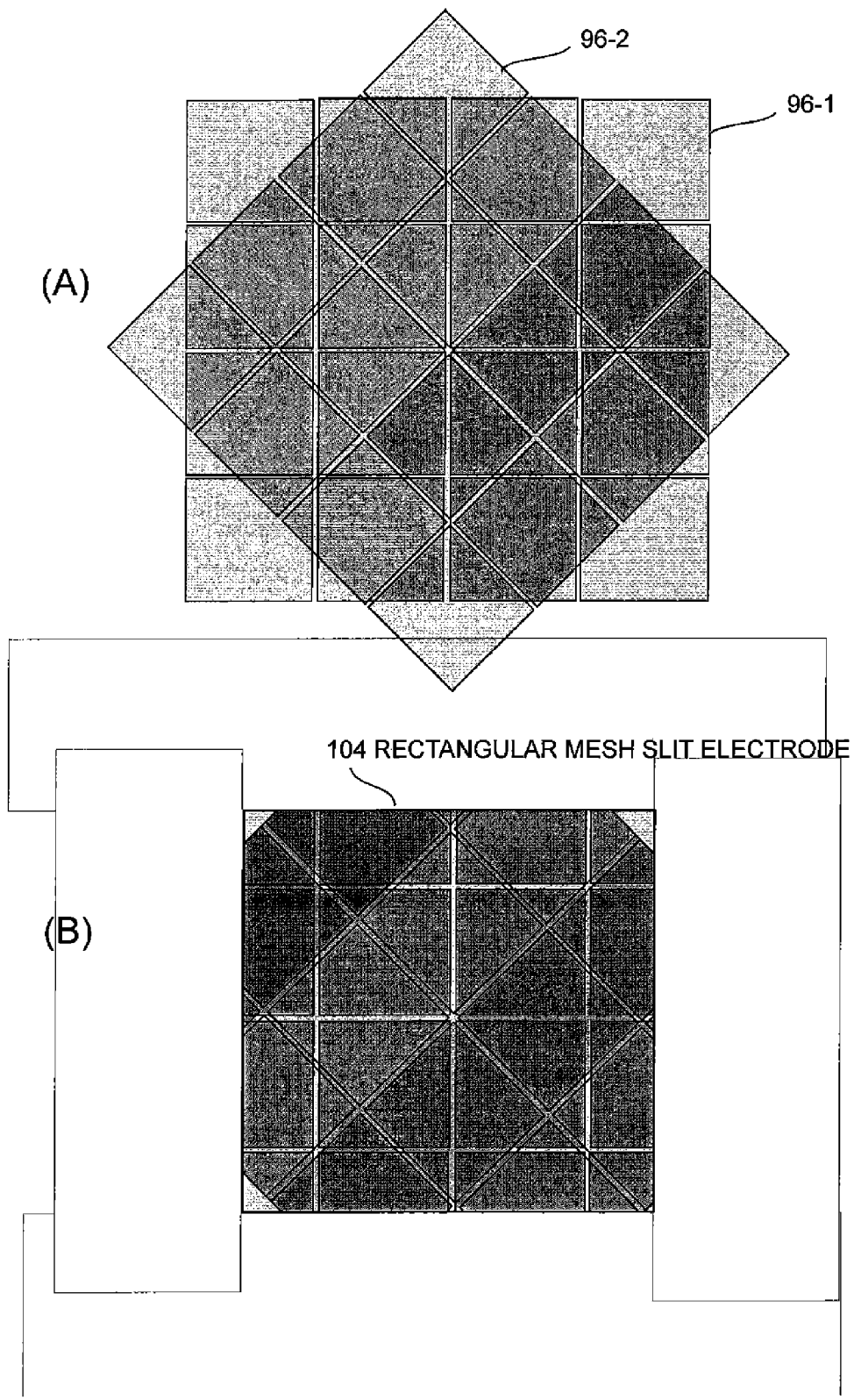
FIG. 23 is a view for explaining a rectangular mesh slit electrode made by superposing the main electrode and the auxiliary electrode using the same rectangular mesh slit electrode patterns A rotated from each other.

FIG. 23 is an explanatory view of forming slits in the auxiliary electrode by rotating the mask when forming the slits in the auxiliary electrode by the same mask as that for the rectangular mesh slit electrode pattern A 96 of the main electrode. In the auxiliary electrode, the rectangular mesh slit electrode pattern A 96-2 is rotated 45 degrees. FIG. 23(B) is a rectangular mesh slit electrode 104 produced by rotating the same rectangular mesh slit electrode patterns A explained in FIG. 23(A) at the central portion of the electrode.

Figure 24:
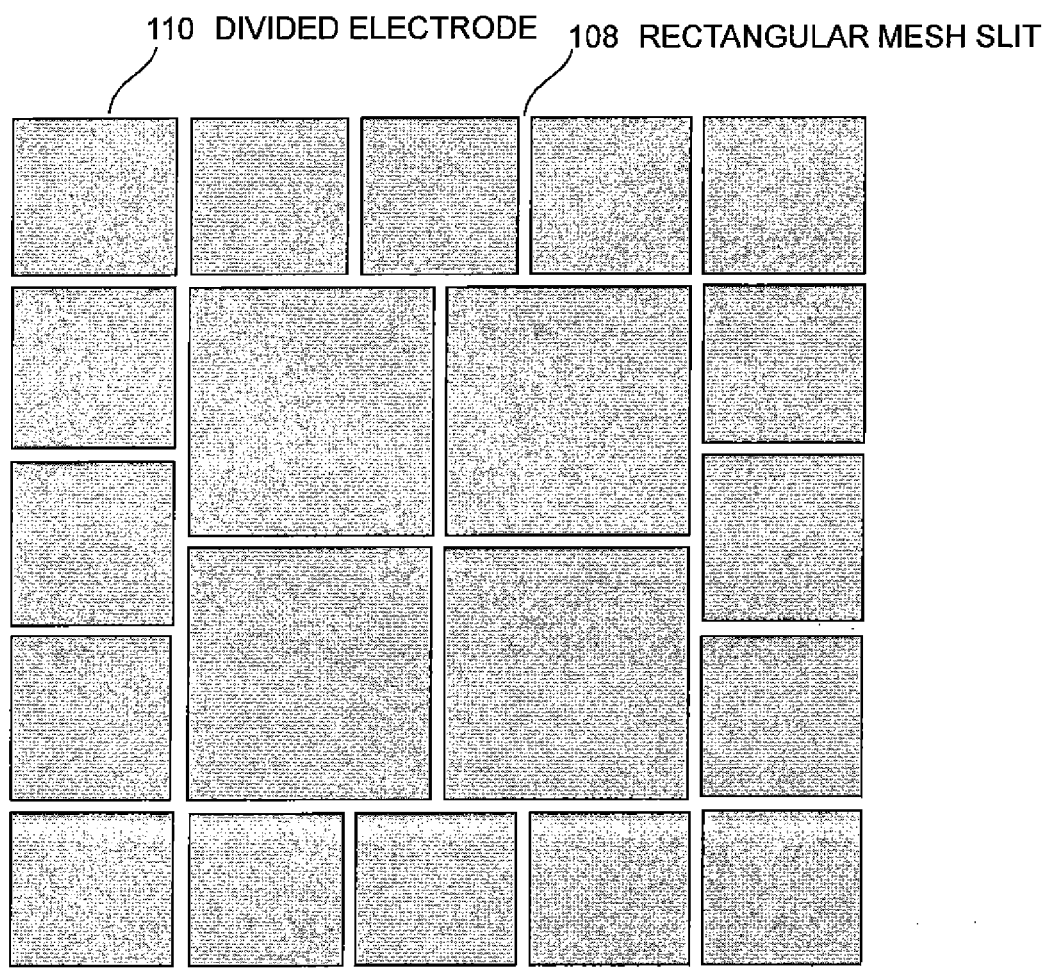
FIG. 24 is a view illustrating a mesh electrode pattern B by rectangular mesh slits in which electrodes distant from the center are made smaller.

FIG. 24 is a rectangular mesh slit electrode pattern B 106 in which divided electrodes near the central portion are made large and divided electrodes near the peripheral portion are made small in a slit pattern in a mesh shape. As illustrated in FIG. 24, the division of the electrode by rectangular mesh slits 108 does not need to form the same electrode shapes but may form electrode shapes smaller toward the peripheral portion of the electrode where stronger stress is generated.

Figure 25:
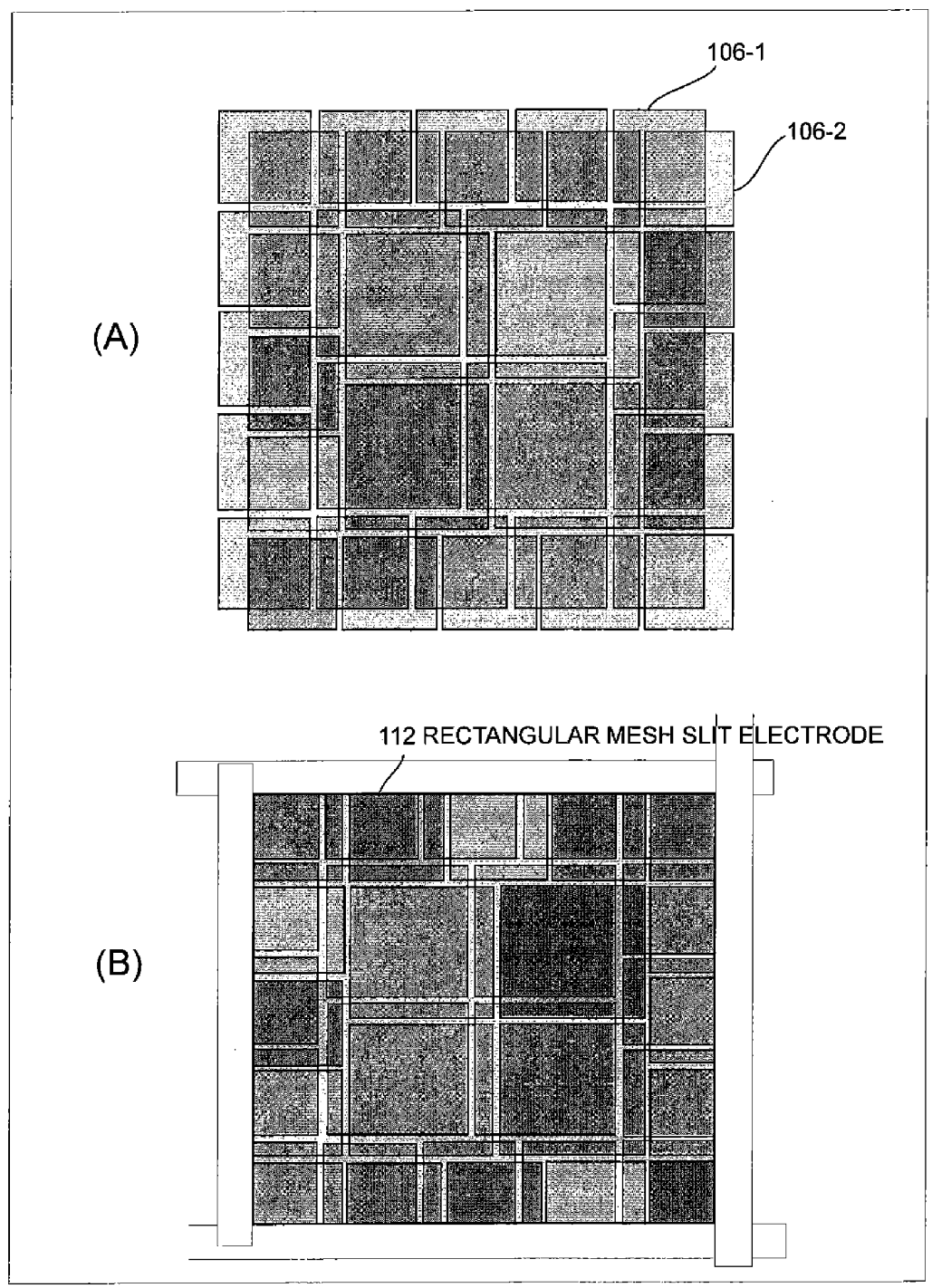
FIG. 25 is a view for explaining a rectangular mesh slit electrode made by superposing the main electrode and the auxiliary electrode using the same rectangular mesh slit electrode patterns B with their positions displaced from each other.

FIG. 25 is a view of a slit electrode produced by forming slits in the main electrode and the auxiliary electrode by the rectangular mesh slit electrode pattern B 106 illustrated in FIG. 24. FIG. 25(A) illustrate a view in which same rectangular mesh slit electrode patterns B 106-1, 106-2 are superposed one on the other with the slit positions of the main electrode and the auxiliary electrode displaced from each other. FIG. 25(B) is a rectangular mesh slit electrode 112 in which the main electrode and the auxiliary electrode are produced with the same rectangular mesh slit electrode patterns A 106-1, 106-2 displaced to positions where their slits do not overlap with each other.

Figure 26:
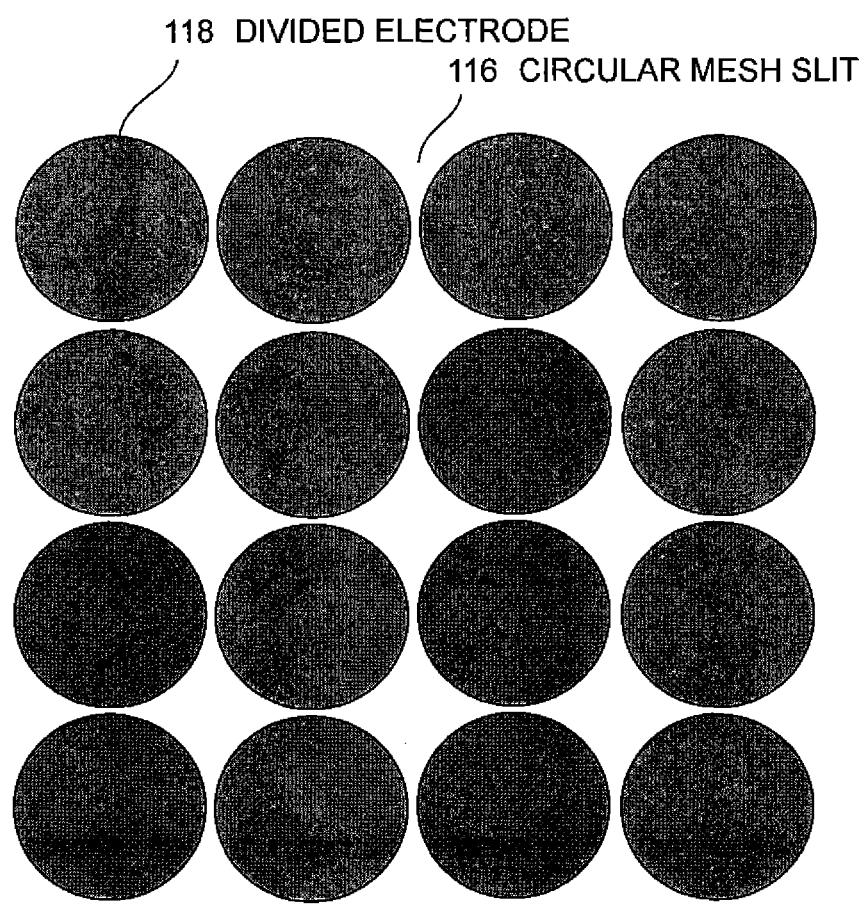
FIG. 26 is a view illustrating a circular mesh slit electrode pattern of the electrode divided into circles by circular mesh slits.

FIG. 26 illustrates a circular mesh slit electrode pattern 114 for dividing the electrode into circular shapes to disperse the stress. The electrode is made into circular divided electrodes 118 by circular mesh slits 116 to thereby eliminate the corner portions where the stress is strong. Therefore, it is possible to more effectively prevent occurrence of cracks.

Figure 27:
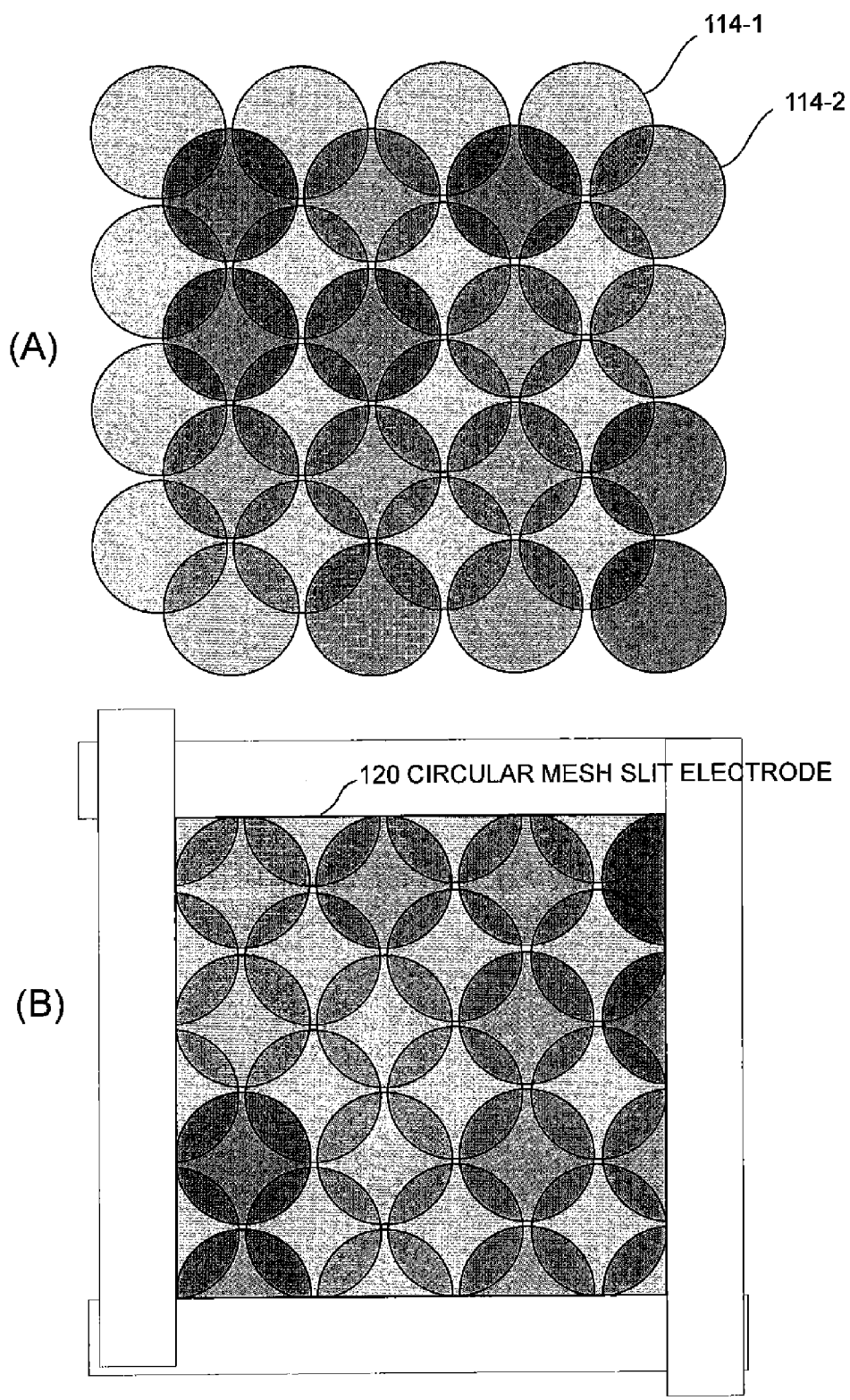
FIG. 27 is a view for explaining a circular mesh slit electrode made by superposing the main electrode and the auxiliary electrode using the same circular mesh slit electrode patterns with their positions displaced from each other.

FIG. 27 is an explanatory view when producing the main electrode and the auxiliary electrode by displacing the circular mesh slit electrode pattern 114 illustrated in FIG. 26. FIG. 27(A) is a view in which circular mesh slit electrode patterns 114-1, 114-2 in the same shape are arranged displaced from each other for the main electrode and the auxiliary electrode. The circular electrode slit patterns 106 have slit portions large in area, and therefore are displaced from each other by a radius of the circular electrode in order to minimize the gap portion when they are superposed. FIG. 27(B) is a circular mesh slit electrode 120 in which the main electrode and the auxiliary electrode are produced with the circular mesh slit electrode patterns 114-1, 114-2 displaced from each other as explained in FIG. 27(A).

The slit patterns for dividing the electrode have been explained in FIGS. 21, 24, 26, in each of which the divided electrodes are individually separated and the same pattern is used for forming the divided electrodes of the main electrode and the auxiliary electrode, so that the gap portions where the electrode is not formed are generated at positions where the slits in the main electrode and the auxiliary electrode overlap with each other. Elimination of the gap portions of the electrode can be realized by previously determining the position to which the pattern is displaced and providing bridges connecting the divided electrodes at portions where the slits overlap with each other.

Figure 28:
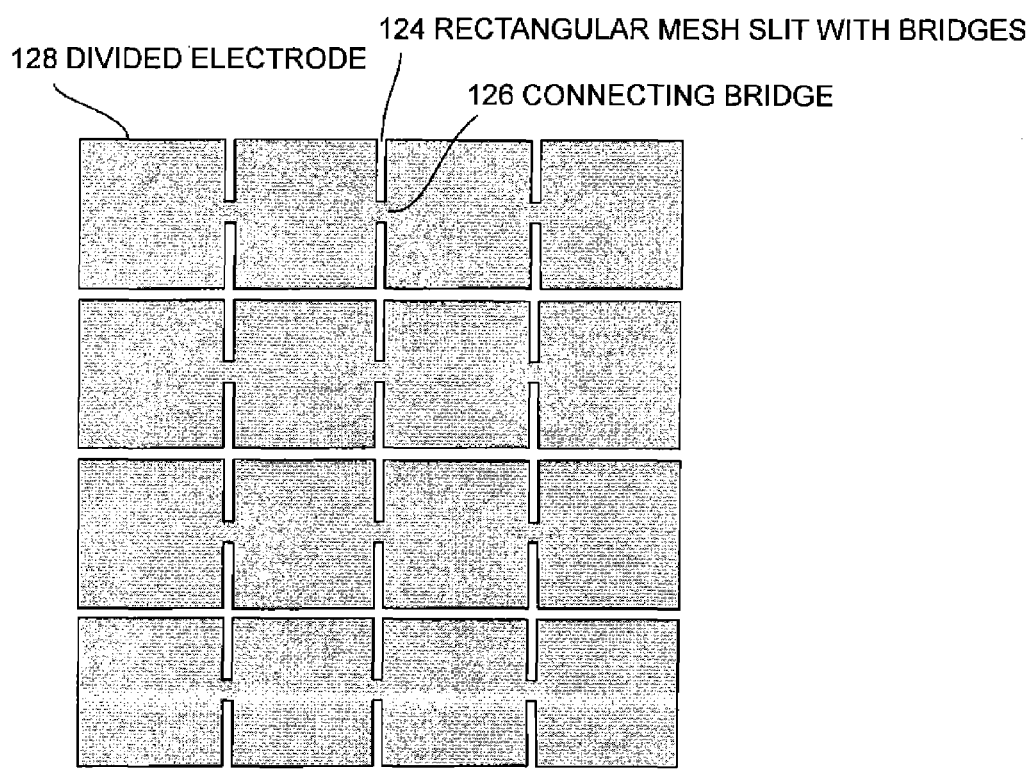
FIG. 28 is a view illustrating a rectangular mesh slit electrode pattern with bridges in which the electrodes divided into rectangular shapes by rectangular mesh slits with bridges are connected by bridges.

FIG. 28 illustrates a rectangular mesh slit electrode pattern with bridges. This is formed by rectangular mesh slits 124 with bridges. A rectangular mesh slit electrode pattern 122 with bridges is made by providing the rectangular mesh slit electrode pattern A 96 illustrated in FIG. 21 with connecting bridges 126 that connect the divided electrodes in the lateral direction. Therefore, divided electrodes 128 are not independent electrodes, but the width of the connecting bridge 126 is small and affects less influence on occurrence of cracks.

Figure 29:
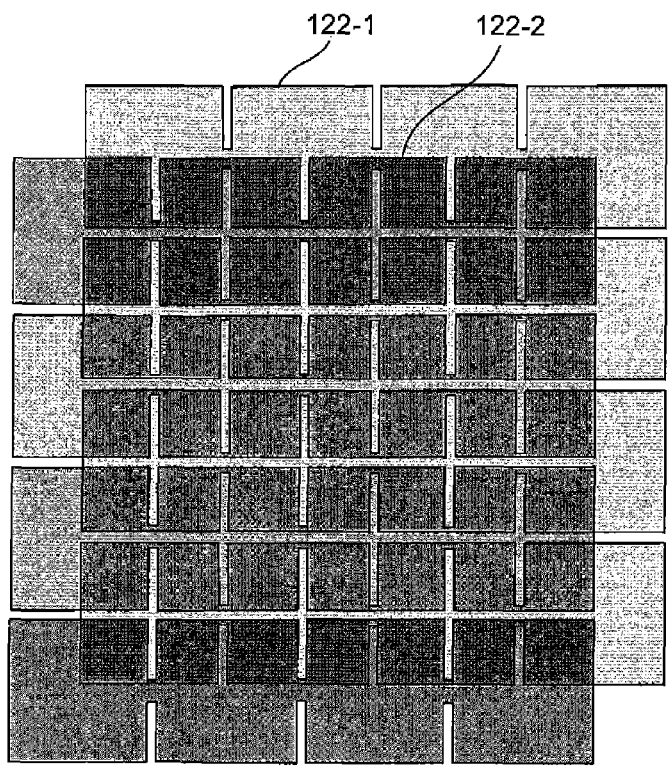
FIG. 29 is a view for explaining a rectangular mesh slit electrode with bridges made by superposing the main electrode and the auxiliary electrode using the same rectangular mesh slit electrode patterns with bridges with their positions displaced from each other.
Figure 29:
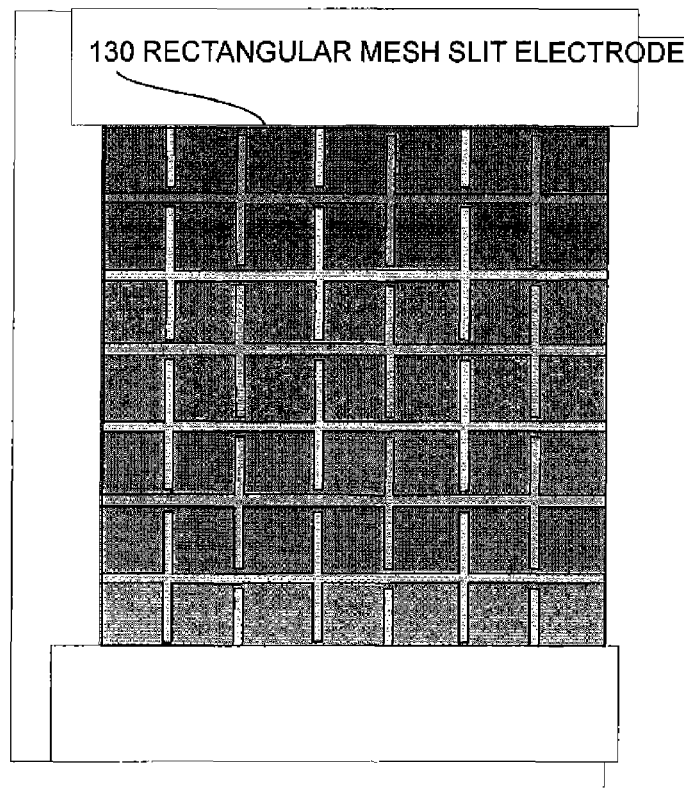

FIG. 29 is an explanatory view when producing the patterns of the main electrode and the auxiliary electrode displaced from each other using the rectangular mesh slit electrode pattern 122 with bridges. FIG. 29(A) illustrates the positional relationship of superposition for producing the main electrode by a rectangular mesh slit electrode pattern 122-1 with bridges and producing the auxiliary electrode with a rectangular mesh slit electrode pattern 122-2 with bridges in the same shape displaced therefrom. The rectangular mesh slit electrode pattern 122-2 with bridges is superposed on the rectangular mesh slit electrode pattern 122-1 with bridges for the main electrode, at positions where the gap portions are not generated in the electrode, by using the connecting bridges 126.

FIG. 29(B) is a rectangular mesh slit electrode 130 with bridges in which the main electrode and the auxiliary electrode are produced by the rectangular mesh slit electrode pattern 122 with bridges. There is no gap portions in the electrode, and it is possible to charge using the entire charge layer.

Figure 30:
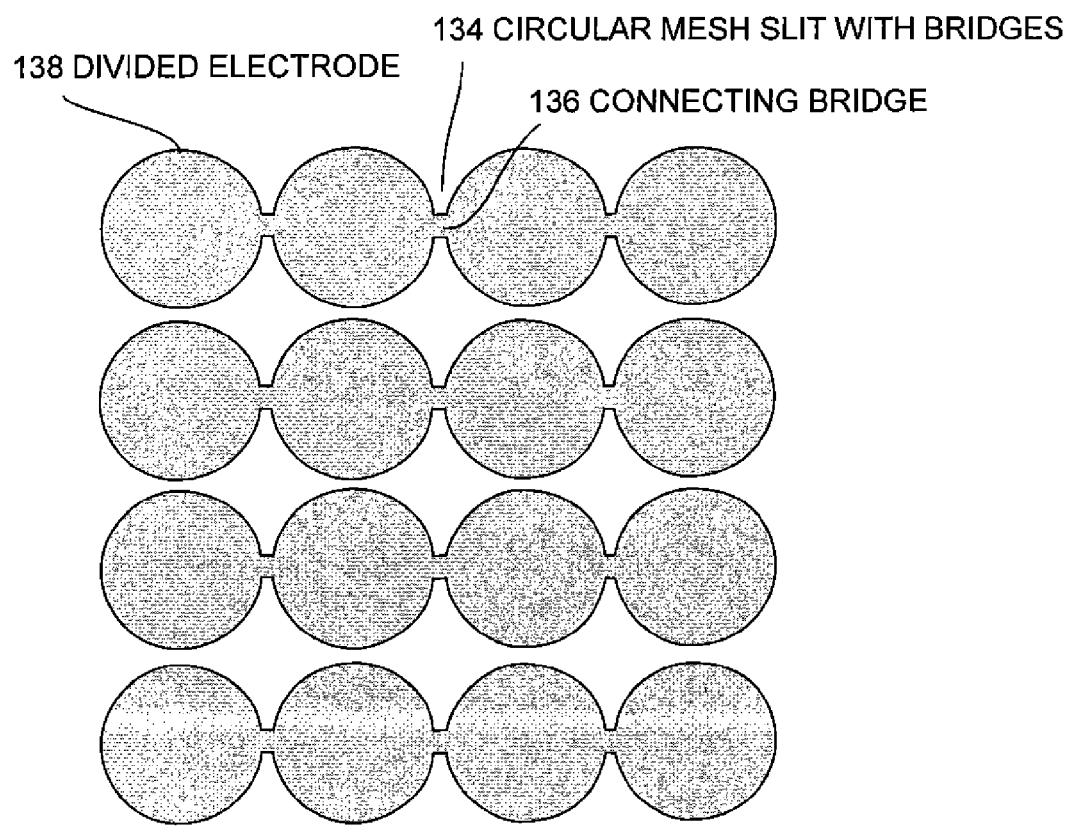
FIG. 30 is a view illustrating a circular mesh slit electrode pattern with bridges in which electrodes divided into circular shapes by circular mesh slits with bridges are connected by bridges.

FIG. 30 illustrates a circular mesh slit electrode pattern with bridges. A circular mesh slit electrode pattern 132 with bridges formed by circular mesh slits 134 with bridges is made by providing the circular mesh slit electrode pattern 114 illustrated in FIG. 26 with connecting bridges 136 that connect divided circular electrodes in the lateral direction. In the case that divided electrodes 138 are circular, the circular mesh slit electrode pattern 114 is decided, as for the position, to be displaced by the radius in terms of shape, and therefore the position where the connecting bridge 136 is provided is naturally the position connecting the centers of the circular electrodes. Also in this case, the width of the connecting bridge 136 is small and affects less influence on occurrence of cracks.

Figure 31:
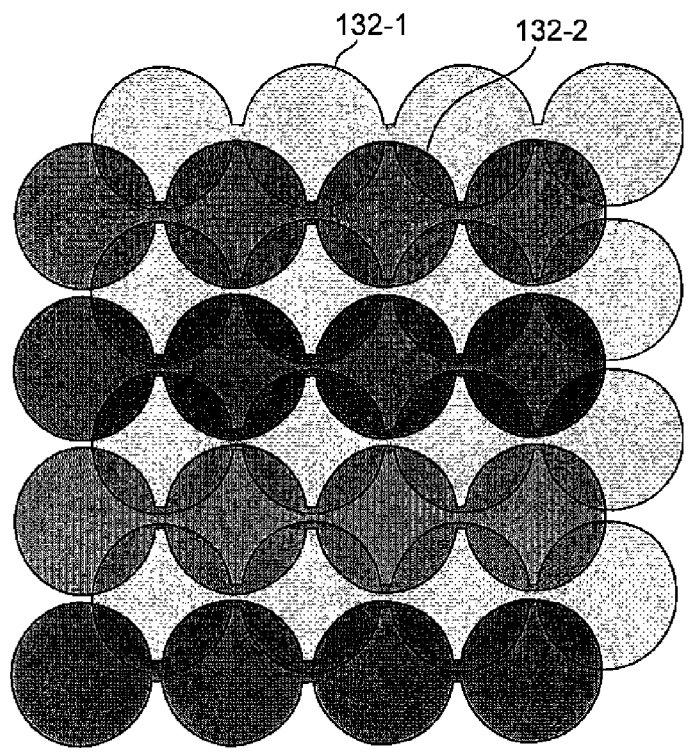
FIG. 31 is a view for explaining a circular mesh slit electrode with bridges made by superposing the main electrode and the auxiliary electrode using the same circular mesh slit electrode patterns with bridges with their positions displaced from each other.
Figure 31:
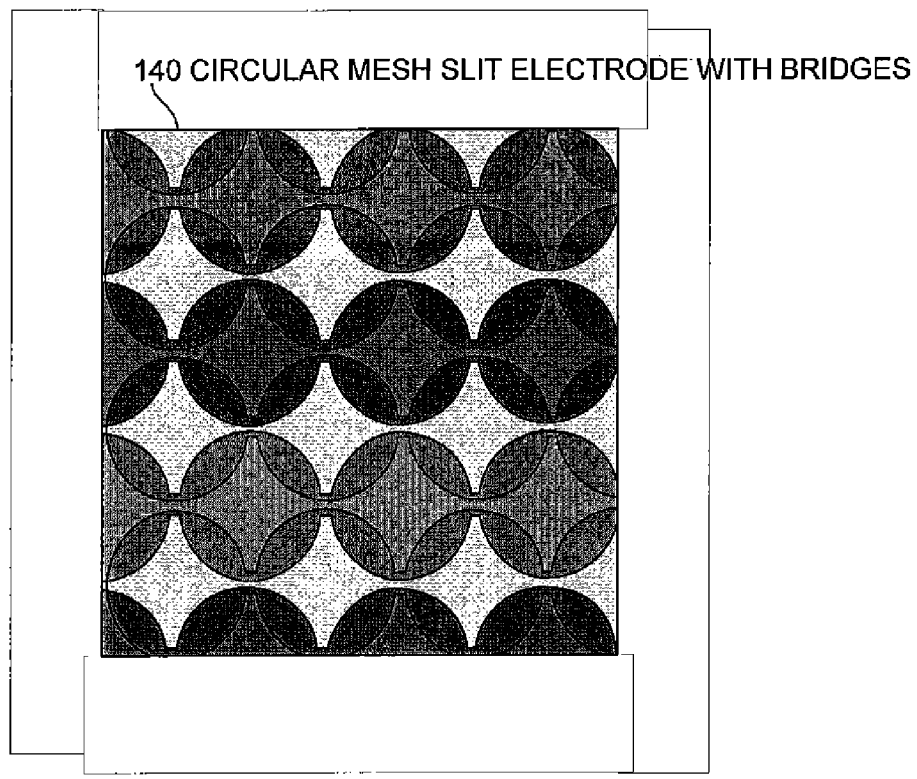

FIG. 31 is an explanatory view when producing the patterns of the main electrode and the auxiliary electrode displaced from each other using the circular mesh slit electrode pattern 132 with bridges. FIG. 30(A) illustrates the positional relationship of superposition for producing the main electrode by a circular mesh slit electrode pattern 132-1 with bridges and producing the auxiliary electrode with a circular mesh slit electrode pattern 132-2 with bridges in the same shape displaced therefrom. The circular mesh slit electrode pattern 132-2 with bridges for the auxiliary electrode is superposed on the circular mesh slit electrode pattern 132-1 with bridges for the main electrode, at positions where the gap portions are not generated in the electrode, by using the connecting bridges 126.

FIG. 31(B) is a circular mesh slit electrode 140 with bridges in which the main electrode and the auxiliary electrode are produced by the circular mesh slit electrode pattern 122 with bridges. There is no gap portions in the electrode, and it is possible to charge using the entire charge layer.

Though the embodiments of the present invention have been described above, the present invention includes appropriate modifications without impairing its object and advantages and is not limited by the above embodiments.

EXPLANATION OF CODES 10 quantum battery
11 substrate
12 first electrode
13 main electrode
14 charge layer
15 auxiliary electrode
17 functional layer
16 p-type metal oxide semiconductor layer
18 second electrode
19 passive layer
20 slit
21 n-type metal oxide semiconductor
22 insulating coating
30, 48 copper
32 titanium dioxide
34 silicone
36 conduction band
38 ultraviolet ray
40 valence band
42 electron
44 energy level
46 fermi level
48 copper
50 nickel oxide
54 glass plate
56 polyimide layer
58 chromium layer
60 copper layer
62 metal electrode
64 surface state of metal electrode
66 cracks
68 analysis model
70 main electrode
72, 76 circular slit
74 auxiliary electrode
78, 80, 90 slit electrode
82, 86 subdivision slit
84, 88 bridge
92, 94 rectangular slit
96, 96-1, 96-2 rectangular mesh slit electrode pattern A
98 rectangular mesh slit
100, 110, 118, 128, 138 divided electrode
102, 104, 112 rectangular mesh slit electrode
106, 106-1, 106-2 rectangular mesh slit electrode pattern B
108 rectangular mesh slit
114, 114-1, 114-2 circular mesh slit electrode pattern
116 circular mesh slit
120 circular mesh slit electrode
122 rectangular mesh slit electrode pattern with bridges
124 rectangular mesh slit with bridges
126, 136 connecting bridge
130 rectangular mesh slit electrode with bridges
132 circular mesh slit electrode pattern with bridges
134 circular mesh slit with bridges
140 circular mesh slit electrode with bridges

What is claimed is:

1. A secondary battery, comprising:
a conductive first electrode, a charge layer having an n-type metal oxide semiconductor covered with an insulating material and undergone a photoexcitation structural change to form an energy level in a band gap so as to trap electrons, a p-type semiconductor layer, and a conductive second electrode, in a stacked structure, wherein:
the conductive first electrode is stacked on and in direct contact with a substrate made of an insulating resin,
the conductive first electrode includes a main electrode having a plurality of slits cut out of the main electrode to prevent occurrence of cracks caused by a difference in thermal expansion coefficient between the substrate and the electrode during heating in the manufacturing process, and an auxiliary electrode covering the slits of the main electrode, and
an interval between the slits is made narrower with distance from a center of the main electrode.

2. The secondary battery according to claim 1, wherein the plurality of slits in the main electrode are formed concentrically from a central portion of the main electrode.

3. The secondary battery according to claim 1,
wherein the plurality of slits in the main electrode are formed in rectangular shapes to surround a central portion of the main electrode.

4. The secondary battery according to claim 2,
wherein in conductive first electrode portions divided by the plurality of slits arranged in the main electrode and the auxiliary electrode, subdivision slits are arranged each of which further divides the electrode portion into a plurality of electrodes.

5. The secondary battery according to claim 4,
wherein the subdivision slits arranged in the main electrode and the subdivision slits arranged in the auxiliary electrode are arranged at positions where the subdivision slits do not overlap with each other.

6. The secondary battery according to claim 5,
wherein the subdivision slits are not arranged at portions where the subdivision slits overlap with the slits arranged in the main electrode and the auxiliary electrode.

7. The secondary battery according to claim 1,
wherein slits in the auxiliary electrode are arranged by displacing a same pattern as a pattern of the slits in the main electrode.

8. The secondary battery according to claim 1,
wherein slits in the auxiliary electrode are arranged by rotating a same pattern as a pattern of the slits in the main electrode.

9. The secondary battery according to claim 7,
wherein the slits in the main electrode is in a mesh shape that divides the electrode into rectangles.

10. The secondary battery according to claim 7,
wherein the slits in the main electrode divides the electrode into circles.

11. The secondary battery according to claim 9,
wherein a rectangular or circular divided electrode divided by the slits located at a position distant from a central portion of the conductive first electrode is smaller than a divided electrode located at the central portion.

12. The secondary battery according to claim 7,
wherein no conductive first electrode is provided at a portion where the slits in the main electrode and the slits in the auxiliary electrode overlap with each other.

13. The secondary battery according to claim 1,
wherein the main electrode and the auxiliary electrode are a metal material having passive characteristics for preventing oxidation.

14. The secondary battery according to claim 1,
wherein the conductive first electrode is made by stacking a metal layer having passive characteristics for preventing oxidation.

15. The secondary battery according to claim 13,
wherein the metal material of the passive layer is at least one of chromium, nickel, titanium, or molybdenum, or an alloy containing at least one of chromium, nickel, titanium, or molybdenum.

16. The secondary battery according to claim 1,
wherein the main electrode and the auxiliary electrode of the conductive first electrode are made from the same material.

* * * * *